(12) United States Patent
Kim et al.

(10) Patent No.: US 9,167,723 B1
(45) Date of Patent: Oct. 20, 2015

(54) SILICON-BASED HEAT-DISSIPATION DEVICE FOR HEAT-GENERATING DEVICES

(71) Applicants: Gerald Ho Kim, Carlsbad, CA (US); Jay Eunjae Kim, Bellevue, WA (US)

(72) Inventors: Gerald Ho Kim, Carlsbad, CA (US); Jay Eunjae Kim, Bellevue, WA (US)

( * ) Notice: Subject to any disclaimer, the term of this patent is extended or adjusted under 35 U.S.C. 154(b) by 0 days.

(21) Appl. No.: 14/262,798

(22) Filed: Apr. 27, 2014

Related U.S. Application Data

(63) Continuation-in-part of application No. 14/242,879, filed on Apr. 2, 2014.

(51) Int. Cl.
*H01L 23/373* (2006.01)
*H05K 7/20* (2006.01)
*F28F 21/08* (2006.01)
*F28F 21/00* (2006.01)

(52) U.S. Cl.
CPC ............ *H05K 7/20418* (2013.01); *F28F 21/00* (2013.01); *F28F 21/085* (2013.01); *H01L 23/3738* (2013.01)

(58) Field of Classification Search
CPC H01L 23/367; H01L 23/3738; H05K 7/2037; H05K 7/20418; F28F 3/048; F28F 21/00; F28F 21/085
USPC .................................. 361/703, 706, 709, 710
See application file for complete search history.

(56) References Cited

U.S. PATENT DOCUMENTS

| | | | | |
|---|---|---|---|---|
| 4,092,614 | A * | 5/1978 | Sakuma et al. | 372/36 |
| 5,455,382 | A * | 10/1995 | Kojima et al. | 174/16.3 |
| 5,794,685 | A * | 8/1998 | Dean | 165/121 |
| 5,940,269 | A * | 8/1999 | Ko et al. | 361/697 |
| 6,958,914 | B2 * | 10/2005 | Hoss | 361/704 |
| 7,027,299 | B2 * | 4/2006 | Wrycraft et al. | 361/695 |
| 8,459,334 | B2 * | 6/2013 | Martin et al. | 165/79 |
| 2008/0223552 | A1 * | 9/2008 | Onishi et al. | 165/80.4 |
| 2009/0103296 | A1 * | 4/2009 | Harbers et al. | 362/234 |
| 2012/0300406 | A1 * | 11/2012 | Fukui et al. | 361/710 |
| 2013/0258597 | A1 * | 10/2013 | Kim et al. | 361/704 |
| 2013/0273694 | A1 * | 10/2013 | Hsieh et al. | 438/113 |

* cited by examiner

*Primary Examiner* — Anatoly Vortman
*Assistant Examiner* — Jacob Crum
(74) *Attorney, Agent, or Firm* — Andy M. Han

(57) ABSTRACT

Embodiments of a silicon-based heat-dissipation device and an apparatus including a silicon-based heat-dissipation device are described. In one aspect, an apparatus includes a silicon-based heat-dissipation device which includes a base portion and a protrusion portion. The base portion has a first primary side and a second primary side opposite the first primary side. The protrusion portion is on the first primary side of the base portion and protruding therefrom. The protrusion portion includes multiple fins. Each of at least two immediately adjacent fins of the fins of the protrusion portion has a tapered profile in a cross-sectional view with a first width near a distal end of the respective fin being less than a second width at a base of the respective fin near the base portion of the heat-dissipation device.

18 Claims, 13 Drawing Sheets

SILICON-BASED HEAT-DISSIPATION DEVICE FOR HEAT-GENERATING DEVICES

CROSS REFERENCE TO RELATED PATENT APPLICATION

The present disclosure is continuation-in-part and claims the priority benefit of U.S. patent application Ser. No. 14/242,879, filed on Apr. 2, 2014 and claiming the priority benefit of U.S. Patent Application No. 61/807,655, filed on Apr. 2, 2013, which applications are herein incorporated by reference.

TECHNICAL FIELD

The present disclosure generally relates to the field of transfer of thermal energy and, more particularly, removal of thermal energy from electrically-driven devices.

BACKGROUND

Unless otherwise indicated herein, the approaches described in this section are not prior art to the claims in this application and are not admitted to be prior art by inclusion in this section.

There are many applications, ranging from consumer electronics to telecommunications and the like, in which electrically-driven devices (e.g., semiconductor-based integrated circuits) capable of performing various tasks are packed in close proximity in a small form factor to serve various needs. Such electrically-driven devices may include, for example, driver circuits, microprocessors, graphics processors, memory chips, global positioning system (GPS) chips, communications chips, laser diodes including edge-emitting lasers and vertical-cavity surface-emitting lasers (VCSELs), light-emitting diodes (LEDs), photodiodes, sensors, etc. Many of such electrically-driven devices inevitably generate thermal energy, or heat, in operation and thus are heat sources during operation as well as for a period of time after power off. As the number and complexity of the functionalities performed by such electrically-driven devices continue to increase and as the distance between electrically-driven devices in the small form factor continues to decrease, heat generated by such electrically-driven devices, as heat sources, present technical challenges that need to be addressed.

For one thing, performance, useful lifespan, or both, of an electrically-driven device may be significantly impacted if the heat generated by the device is not adequately dissipated or otherwise removed from the device. Moreover, in many present-day applications, given the close proximity between two or more electrically-driven devices on the same substrate, e.g., printed circuit board (PCB), a phenomenon of thermal coupling between the two or more devices in close proximity may occur and result in the heat generated by one of the devices being transferred to one or more adjacent devices. When thermal coupling occurs, at least a portion of the heat generated by a first electrically-driven devices is transferred to a second electrically-driven device in close proximity due to temperature gradient, such that the temperature of the second electrically-driven device rises to a point higher than it would be when no heat is transferred from the first electrically-driven device to the second electrically-driven device. More specifically, when thermal coupling occurs and when no adequate heat transfer mechanism exists, heat generated by electrically-driven devices in close proximity may detrimentally deteriorate the performance and useful lifespan of some or all of the affected devices. As electrically-driven devices generate heat, they are referred to as heat-generating devices hereinafter.

Metal heat sinks or radiators, based on copper or aluminum for example, have been a dominant heat sink choice for electronics or photonics applications. As the form factor of electronic components (e.g., integrated circuits or IC) gets smaller it is impractical to build a small metal heat sink with a large surface area heat sink. Other problems associated with metal heat sinks include, for example, difficulty in precision alignment in mounting laser diode bars, VCSELs, LEDs or chips in laser diode/VCSEL/LED cooling applications, issues with overall compactness of the package, corrosion of the metallic material in water-cooled applications, difficulty in manufacturing, high-precision fabrication, electrical isolation, etc. Yet, increasing demand for higher power density in small form factor motivates the production of a compact cooling package with fewer or none of the aforementioned issues. Moreover, conventional packages typically use wire bonding to provide electrical power to the electrically-driven device(s) being cooled, but wire bonding may add cost and complexity in manufacturing and may be prone to defects in addition to occupying space unnecessarily.

SUMMARY

Various embodiments disclosed herein pertain to a technique, design, scheme, device and mechanism for isolation of thermal ground for multiple heat-generating devices on a substrate.

According to one aspect of the present disclosure, an apparatus may include a silicon-based heat-dissipation device. The silicon-based heat-dissipation device may include a base portion and a protrusion portion. The base portion may have a first primary side and a second primary side opposite the first primary side. The protrusion portion may be on the first primary side of the base portion and may protrude therefrom. The second primary side of the base portion may be configured to have one or more heat-generating devices embedded therein or physically coupled thereto such that at least a portion of heat generated by the one or more heat-generating devices is dissipated to the silicon-based heat-dissipation device by conduction. The silicon-based heat-dissipation device may have a surface area such that, for every 1 watt of power loading of the one or more heat-generating devices, the surface area of the silicon-based heat-dissipation device is in a range of approximately 400 mm$^2$/watt to 2000 mm$^2$/watt.

In at least one embodiment, the base portion may include a slit that communicatively connects the first primary side and the second primary side of the base portion.

In at least one embodiment, when each of more than one heat-generating devices is embedded in or physically coupled to the base portion, at least a first heat-generating device of the more than one heat-generating devices may be on a first side of the slit and at least a second heat-generating device of the more than one heat-generating devices may be on a second side of the slit opposite the first side of the slit such that the slit severs a direct-line thermal coupling path via conduction through the base portion between the first and the second heat-generating devices.

In at least one embodiment, the slit may include an L-shaped slit.

In at least one embodiment, the protrusion portion of the silicon-based heat-dissipation device may include a plurality of fins.

In at least one embodiment, the plurality of fins may include a plurality of straight fins.

In at least one embodiment, a ratio of a height of the fins, measured from the first primary side of the base portion in a direction perpendicular to the first primary side, to a thickness of each of the fins, measured across a respective one of the fins in a direction parallel to the first primary side of the base portion, may be greater than 5:1.

In at least one embodiment, a ratio of a height of the fins, measured from the first primary side of the base portion in a direction perpendicular to the first primary side, to a thickness of the base portion, measured across the base portion in a direction parallel to the first primary side of the base portion, may be greater than 5:1.

In at least one embodiment, a spacing between every two fins of the fins, measured between respective two fins of the fins in a direction parallel to the first primary side of the base portion, may be greater than or equal to a thickness of each of the fins, measured across a respective one of the fins in the direction parallel to the first primary side of the base portion.

In at least one embodiment, the plurality of fins may include a plurality of tapered fins.

In at least one embodiment, at least a first fin of the tapered fins may have a tapered angle between a surface of the first fin and a normal line perpendicular to a horizontal plane defined by the first primary side of the base portion. The tapered angle may be less than or equal to 5 degrees.

In at least one embodiment, the apparatus may further include a copper layer coupled to the second primary side of the base portion with a thickness of the copper layer being in a range of approximately 3 µm to 30 µm.

In at least one embodiment, the apparatus may further include one or more integrated circuits embedded in the second primary side of the base portion or one or more electrically-driven devices physically coupled to the second primary side of the base portion. At least a first one of the one or more integrated circuits or the one or more electrically-driven devices may be on a first side of the slit. At least a second one of the one or more integrated circuits or the one or more electrically-driven devices may be on a second side of the slit opposite the first side of the slit. The slit may sever a direct-line thermal coupling path via conduction through the base portion between the first one of the one or more integrated circuits or the one or more electrically-driven devices and the second one of the one or more integrated circuits or the one or more electrically-driven devices.

In at least one embodiment, the silicon-based heat-dissipation device may be made from a blank silicon substrate of single-crystal silicon. The protrusion portion may have a surface area of approximately 5 mm$^2$ to 40 mm$^2$ surface area of the protrusion portion per 1 mm$^2$ surface area of a blank silicon substrate from which the silicon-based heat-dissipation device is made.

According to another aspect, an apparatus may include a silicon-based heat-dissipation device. The silicon-based heat-dissipation device may include a base portion and a protrusion portion. The second primary side may be configured to have one or more heat-generating devices embedded therein or physically coupled thereto. The base portion may have a first primary side and a second primary side opposite the first primary side. The protrusion portion may be on the first primary side of the base portion and protruding therefrom. The protrusion portion may include a plurality of fins. Each of at least two immediately adjacent fins of the fins of the protrusion portion may have a tapered profile in a cross-sectional view with a first width near a distal end of the respective fin being less than a second width at a base of the respective fin near the base portion of the heat-dissipation device. The silicon-based heat-dissipation device may have a surface area such that, for every 1 watt of power loading of the one or more heat-generating devices, the surface area of the silicon-based heat-dissipation device is in a range of approximately 400 mm$^2$/watt to 2000 mm$^2$/watt.

In at least one embodiment, the second primary side of the base portion may be configured to have one or more heat-generating devices embedded therein or physically coupled thereto such that at least a portion of heat generated by the one or more heat-generating devices is dissipated to the silicon-based heat-dissipation device by conduction.

In at least one embodiment, at least a first fin of the tapered fins may have a tapered angle between a surface of the first fin and a normal line perpendicular to a horizontal plane defined by the first primary side of the base portion. The tapered angle may be less than or equal to 5 degrees.

In at least one embodiment, the apparatus may further include a copper layer coupled to the second primary side of the base portion with a thickness of the copper layer being in a range of approximately 3 µm to 30 µm.

In at least one embodiment, the apparatus may further include one or more integrated circuits embedded in the second primary side of the base portion or one or more electrically-driven devices physically coupled to the second primary side of the base portion. The base portion may include a slit that communicatively connects the first primary side and the second primary side of the base portion. At least a first one of the one or more integrated circuits or the one or more electrically-driven devices may be on a first side of the slit. At least a second one of the one or more integrated circuits or the one or more electrically-driven devices may be on a second side of the slit opposite the first side of the slit. The slit may sever a direct-line thermal coupling path via conduction through the base portion between the first one of the one or more integrated circuits or the one or more electrically-driven devices and the second one of the one or more integrated circuits or the one or more electrically-driven devices.

In at least one embodiment, the silicon-based heat-dissipation device may be made from a blank silicon substrate of single-crystal silicon. The protrusion portion may have a surface area of approximately 5 mm$^2$ to 40 mm$^2$ surface area of the fins per 1 mm$^2$ surface area of a blank silicon substrate from which the silicon-based heat-dissipation device is made.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The accompanying drawings are included to provide a further understanding of the disclosure, and are incorporated in and constitute a part of the present disclosure. The drawings illustrate embodiments of the disclosure and, together with the description, serve to explain the principles of the disclosure. It is appreciable that the drawings are not necessarily in scale as some components may be shown to be out of proportion than the size in actual implementation in order to clearly illustrate the concept of the present disclosure.

DETAILED DESCRIPTION OF PREFERRED EMBODIMENTS

Overview

A compact heat sink or radiator built with silicon-based material provide a compact and highly efficient heat sink for all electronics applications such as driver circuits, microprocessors, graphics processors, memory chips, GPS chips, communications chips, laser diodes including edge-emitting lasers and VCSELs, LEDs, photodiodes, sensors, etc. One advantage of a silicon-based heat sink or radiator is that it can have a surface area more than ten times that of a typical metal-based heat sink or radiator which may be fabricated by extrusion, stamping or machining process. Besides, the surface quality of the silicon fins of a silicon-based heat sink or radiator can reach an optically polished quality surpassing the surface quality of conventional metal-based heat sinks and radiators. A silicon-based heat sink or radiator does not corrode or become tarnished in atmosphere due to elements of the environment. In contrast, metal-based heat sinks and radiators tend to foul and/or corrode over time. The aforementioned advantages enhance the reliability and thermal dissipation efficiency of silicon-based heat sinks and radiators.

Illustrative Implementations

Figure 1:
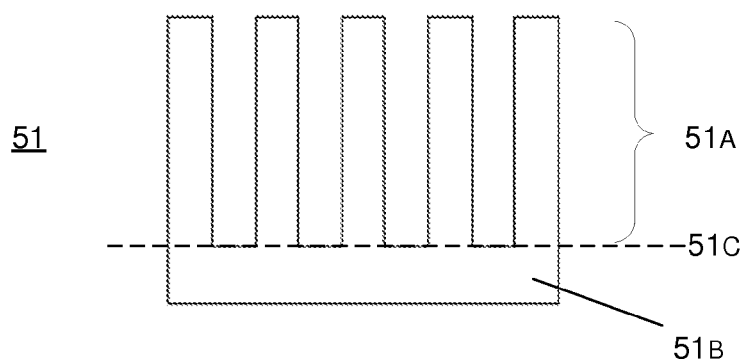
FIG. 1 is a partial cross-sectional view of a heat-dissipation device in accordance with an embodiment of the present disclosure.
Figure 2:
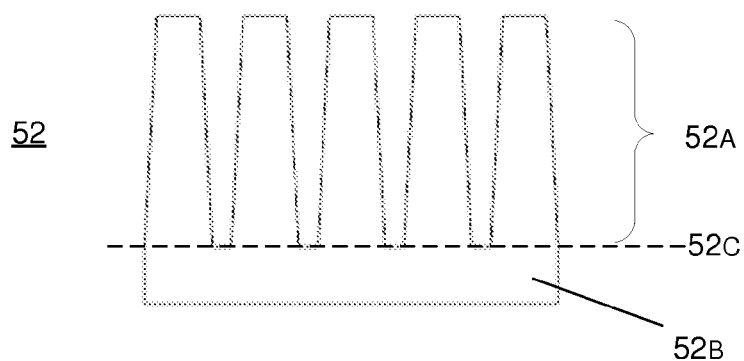
FIG. 2 is a partial cross-sectional view of a heat-dissipation device in accordance with an embodiment of the present disclosure.
Figure 3:
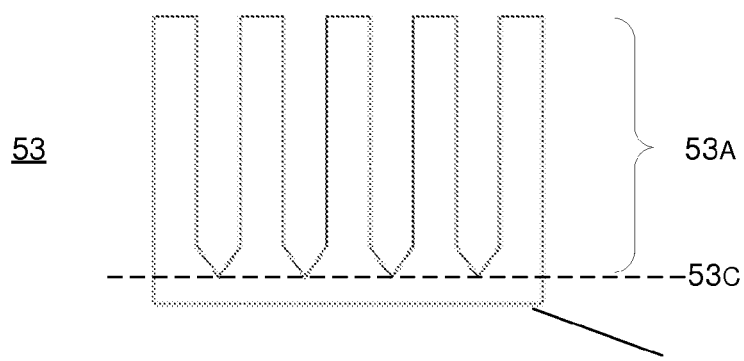
FIG. 3 is a partial cross-sectional view of a heat-dissipation device in accordance with an embodiment of the present disclosure.
Figure 4:
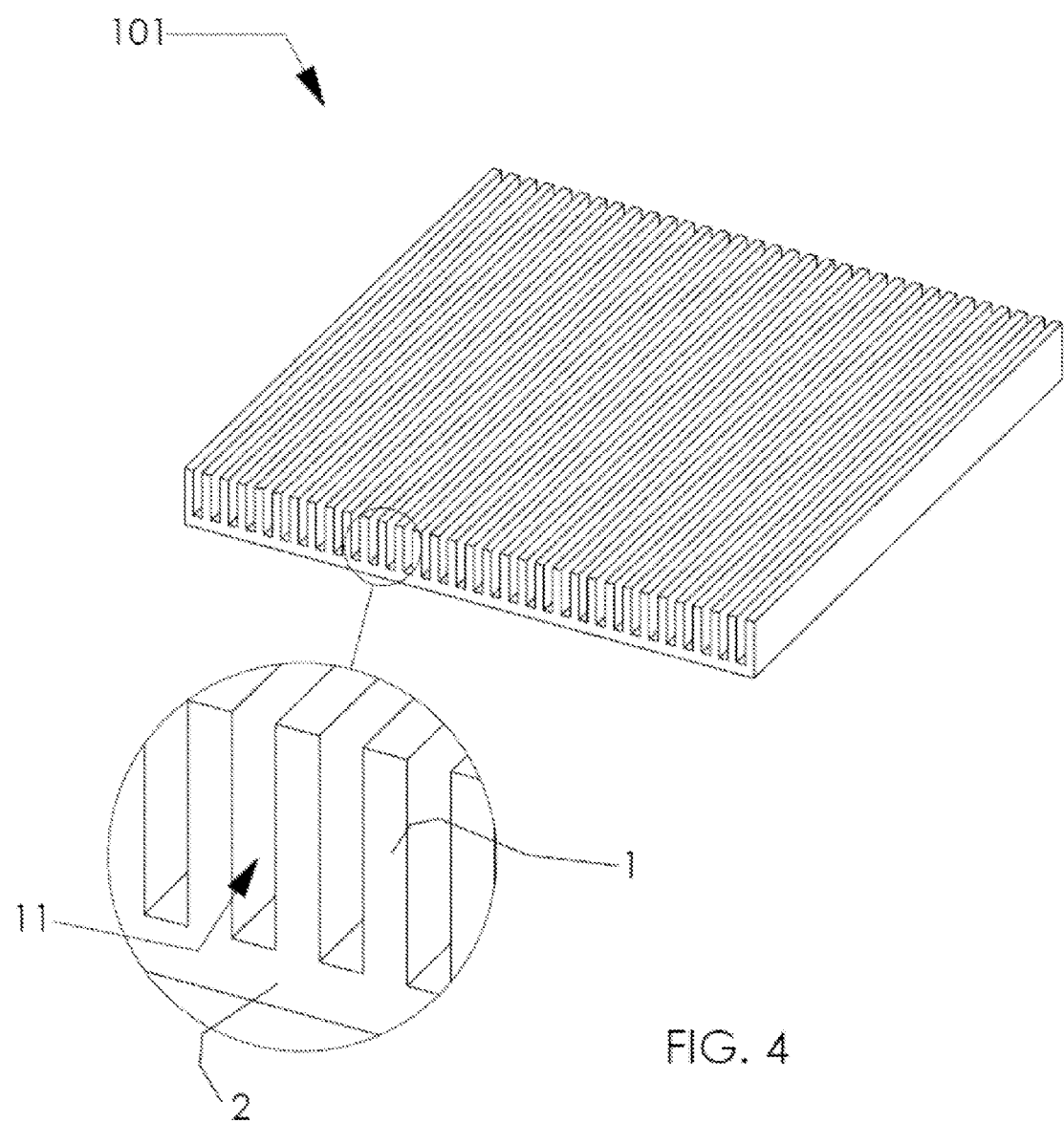
FIG. 4 is a perspective view of a heat-dissipation device in accordance with an embodiment of the present disclosure.

Each of FIGS. 1-3 respectively illustrates a partial cross-sectional view of a silicon-based heat-dissipation device in accordance with an embodiment of the present disclosure. FIG. 4 illustrates a silicon-based heat-dissipation device 101 in accordance with an embodiment of the present disclosure.

Figure 5:
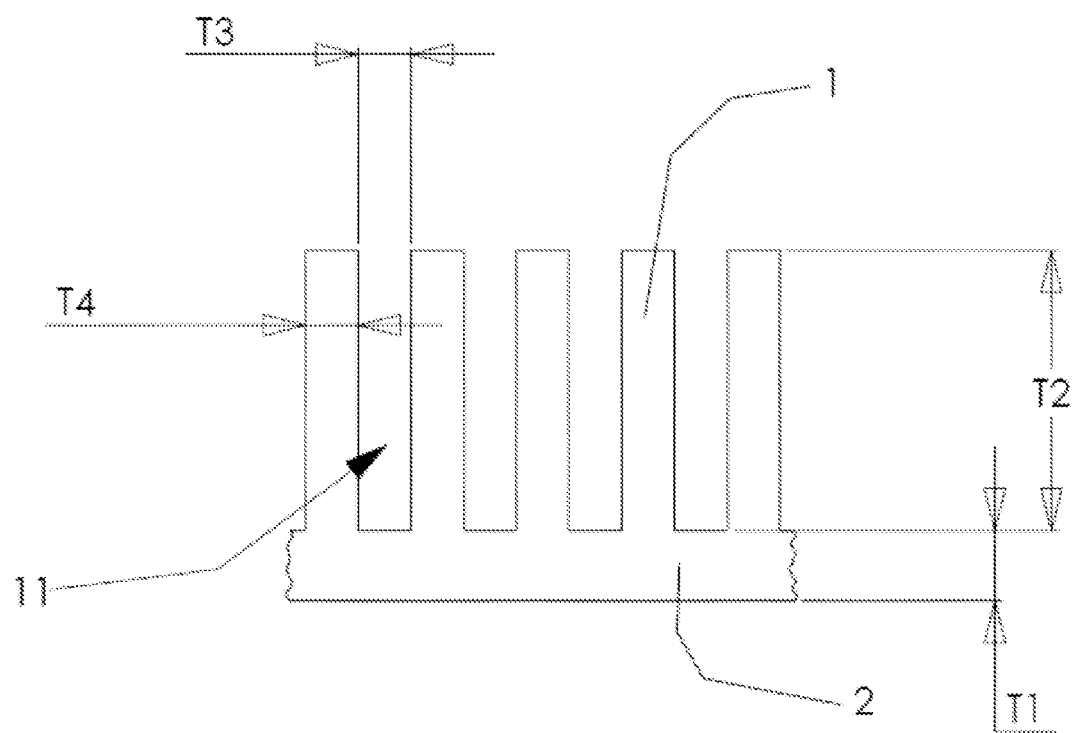
FIG. 5 is a partial cross-sectional view of the heat-dissipation device of FIG. 4.

FIG. 5 illustrates dimensions associated with the silicon-based heat-dissipation device of FIG. 4. The following description refers to FIGS. 1-5.

Each of FIGS. 1-3 illustrates a respective embodiment of a cross-sectional view of a fin structure of multiple straight fins of a silicon-based heat-dissipation device 101. Due to efficient thermal performance and compact structure of the silicon-based heat-dissipation device 101, a surface area at least ten times that of a typical metal-based heat sink or radiator to interact with air or air-sol cooling can be achieved.

As shown in FIG. 1, in one embodiment, a fin structure 51 of multiple straight fins of silicon-based heat dissipation device 101 includes a protrusion portion 51a and a base portion 51b. The protrusion portion 51a has a number of fins protruding from a horizontal plane 51c defined by the base portion 51b. Fins of fin structure 51 have substantially straight and parallel sidewalls. That is, in fin structure 51, a surface of a sidewall of a given one of the fins is substantially parallel to a surface of an opposing sidewall of an immediately adjacent fin. Further, a surface of a sidewall of a given one of the fins is substantially perpendicular to the horizontal plane 51c. Moreover, as shown in FIG. 1, trenches, i.e., where the protrusion portion 51a come in contact with the base portion 51b, of fin structure 51 are relatively flat or horizontal with respect to the horizontal plane 51c.

As shown in FIG. 2, in one embodiment, a fin structure 52 of multiple straight fins of silicon-based heat dissipation device 101 includes a protrusion portion 52a and a base portion 52b. The protrusion portion 52a has a number of fins protruding from a horizontal plane 52c defined by the base portion 52b. Fins of fin structure 52 have sloped or tapered sidewalls. That is, in fin structure 52, a surface of a sidewall of a given one of the fins is not parallel to a surface of an opposing sidewall of an immediately adjacent fin. Further, a surface of a sidewall of a given one of the fins is not perpendicular to the horizontal plane 52c. Referring to FIG. 2, due to the sidewalls of the fins of protrusion portion 52a being sloped or tapered, a spacing, or gap, between every two immediately adjacent fins of protrusion portion 52a increases in a direction moving from base portion 52b toward the distal ends of the fins of protrusion portion 52a. In other words, due to the sloped or tapered sidewalls, a spacing or gap between every two immediately adjacent fins is wider near the distal ends of the fins (e.g., at the top as shown in FIG. 2) than it is near the base of the fins (e.g., near the base portion 52b as shown in FIG. 2). Put differently, given the sloped or tapered sidewalls, each of one or more fins of the protrusion portion 52a has a tapered profile in a cross-sectional view (as shown in FIG. 2) with a first width near the distal end of the respective fin being less than a second width at the base of the respective fin near the base portion 52b. Moreover, as shown in FIG. 2, trenches, i.e., where the protrusion portion 52a come in contact with the base portion 52b, of fin structure 52 may be relatively flat or horizontal with respect to the horizontal plane 52c. Alternatively, although not shown in FIG. 2, the trenches of fin structure 52 may be notched, e.g., shaped as V-shaped notches as those shown in FIG. 3.

Compared with the fin structure 51 of FIG. 1, fin structure 52 of FIG. 2 tends to improve the aerodynamics for better heat transfer via convection by a fluid, e.g., air blown by one or more fans, flowing between the fins. When temperature in the fins rises and the fluid between the fins, whether flowing through or stagnant, will be warmed up. Fin structure 51 of FIG. 1 tends to have relatively less efficiency in heat transfer from the fins to the fluid, e.g., air, at least for the corner air at the bottom of the trenches in terms of pushing the air out of the protrusion portion 51a. In contrast, fin structure 52 of FIG. 2 tends to have relatively more efficiency in pushing air out of the bottom of the trenches to come out of the protrusion portion 52a. The difference in efficiency is in the order of several percentage points.

As shown in FIG. 3, in one embodiment, a fin structure 53 of multiple straight fins of silicon-based heat dissipation device 101 includes a protrusion portion 53a and a base portion 53b. The protrusion portion 53a has a number of fins protruding from a horizontal plane 53c defined by the base portion 53b. Fins of fin structure 53 have substantially straight and parallel sidewalls. That is, in fin structure 53, a surface of a sidewall of a given one of the fins is substantially parallel to a surface of an opposing sidewall of an immediately adjacent fin. Further, a surface of a sidewall of a given one of the fins is substantially perpendicular to the horizontal plane 53c. Moreover, as shown in FIG. 3, trenches, i.e., where the protrusion portion 53a come in contact with the base portion 53b, of fin structure 53 are not flat or horizontal with respect to the horizontal plane 53c. Rather, different from fin structure 51 of FIG. 1, the trenches of fin structure 53 are notched, e.g., shaped as V-shaped notches as those shown in FIG. 3.

Fin structure 53 of FIG. 3 tends to have better heat dissipation performance than that of fin structure 51 of FIG. 1, but worse than that of fin structure 52 of FIG. 2 due to aerodynamics, assuming each of fin structures 51, 52 and 53 has the same amount of surface area for the sidewalls of the fins.

The silicon-based heat-dissipation device 101 shown in FIG. 4 can be fabricated from a piece of single-crystal silicon by etching various structural shapes as shown in FIGS. 1-3. As shown in FIG. 4, the silicon-based heat-dissipation device 101 has a base portion 2 and a protrusion portion 1. The base portion 2 has a first primary side (e.g., the side that faces up in FIG. 4) and a second primary side (e.g., the side that faces down in FIG. 4) opposite the first primary side. The protrusion portion 1 of the silicon-based heat-dissipation device 101 is on the first primary side of the base portion 2 and protrudes therefrom. In the example shown in FIG. 4, the protrusion portion 1 includes multiple straight fins. The multiple straight fins of the protrusion portion 1 may be spaced apart from each other by an equidistant spacing 11. Additionally or alternatively, the protrusion portion 1 may include pin fins and/or flared fins.

As shown in FIG. 5, there are several dimensions associated with the silicon-based heat-dissipation device 101. T1 denotes a thickness of the base portion 2 that is measured across the base portion 2 in a direction parallel to the first primary side of the base portion 2. T2 denotes a height of the protrusion portion 1, or the fins of the protrusion portion 1, that is measured from the first primary side of the base portion 2 in a direction perpendicular to the first primary side of the base portion 2. T3 denotes a width of the spacing 11 between every two adjacent fins of the protrusion portion 1. T4 denotes a thickness of each of the fins of the protrusion portion 1, measured across a respective one of the fins in a direction parallel to the first primary side of the base portion 2.

In one embodiment, the ratio T2:T4 is a large number in order to increase the surface area of the silicon-based heat-dissipation device 101 in a small footprint of silicon base. In order to achieve a high convective cooling in the silicon-based heat-dissipation device 101, the ratio of T2:T4 is greater than 5:1. Similarly, the ratio T2:T1 is greater than 5:1. Moreover, in one embodiment, T3 is greater than or equal to T4. These dimensions and ratios provide an optimum performance of the silicon-based heat-dissipation device 101. For example, if each of the dimensions T3 and T4 is 100 microns with T2 being 500 microns and T1 being 100 microns, then the silicon-based heat-dissipation device 101 would have a large amount of surface area in a compact form factor. However, air flow through the spacing 11 between every two adjacent fins of the protrusion portion 1 may be restricted due to small gap, T3 to ineffectively remove all heat from silicon fin. To maximize thermal convection by air flow through the spacing 11 between every two adjacent fins of the protrusion portion 1, in various implementations the dimension T3 and air speed can be increased to achieve quick removal of heat from the fins of the silicon-based heat-dissipation device 101.

Figure 6:
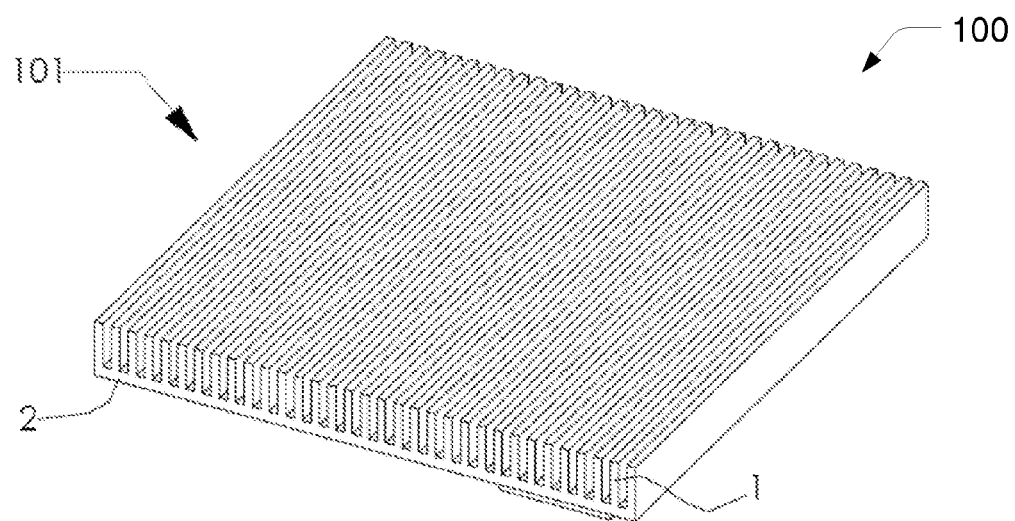
FIG. 6 is a perspective top view of a device in accordance with an embodiment of the present disclosure.
Figure 7:
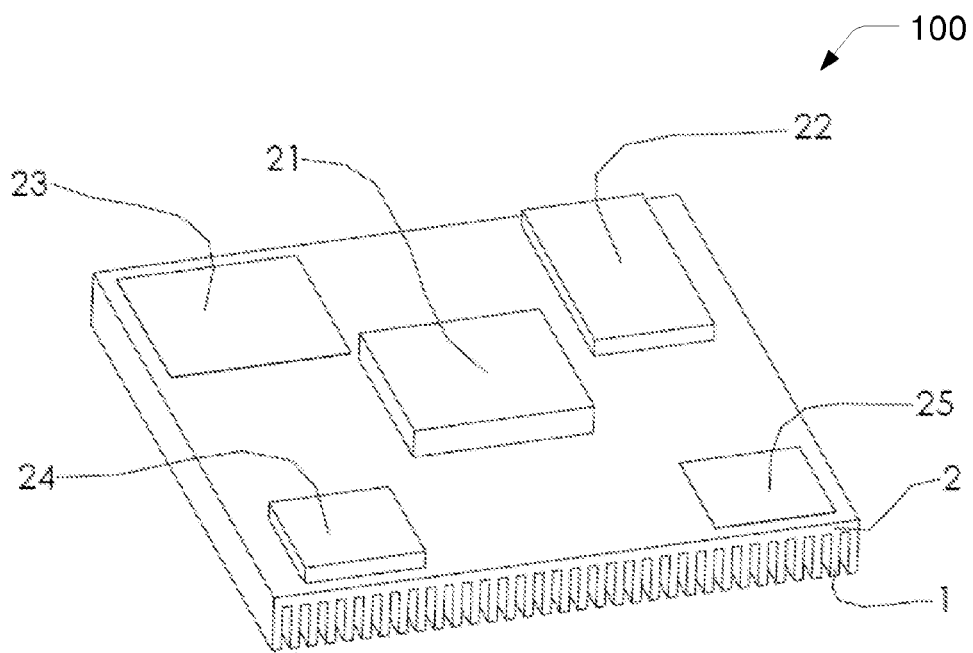
FIG. 7 is a perspective bottom view of the device of FIG. 6.
Figure 8:
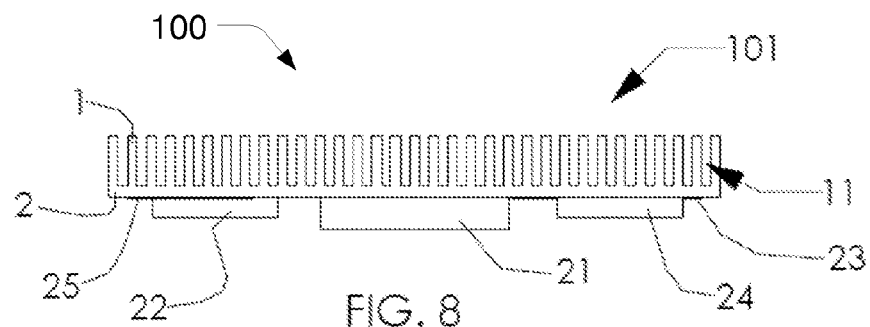
FIG. 8 is a side view of the device of FIG. 6.

FIGS. 6-8 illustrate a device 100 in accordance with an embodiment of the present disclosure. The following description refers to FIGS. 6-8.

FIG. 6 shows the device 100 which is a monolithic structure of IC chip or Silicon-On-Insulator (SOI) combined with the silicon-based heat-dissipation device 101. Typically integrated circuits are developed or laid-down on a primary side of a silicon wafer, and then the backside of the silicon wafer opposite the primary side is lapped to make a thin silicon IC chip. In one embodiment, the silicon-based heat-dissipation device 101 is built or attached to the backside of the IC or SOI chip to increase the heat dissipation by increasing the surface area of the existing backside of the IC or SOI structure. The silicon-based heat-dissipation device 101 built on the backside of the IC or SOI chip provides more than ten times (10×) of surface area to dissipate heat from the integrated circuits by convection or forced air, compared to conventional metal-based heat sinks or radiators.

As shown in FIGS. 7 and 8, each of heat-generating devices 21-25 is embedded in or physically coupled, mounted or otherwise attached to the second primary side of the base portion 2. Each of heat-generating devices 23 and 25 may be an embedded or doped integrated circuit while each of heat-generating devices 21, 22 and 24 may be a driver chip, microprocessor, graphics processor, memory chip, GPS chip, communications chip, laser diode (edge-emitting or VCSEL), LED, photodiode, sensor or the like. Regardless what the case may be, each of heat-generating devices 21-25 generates heat when powered on for which heat needs to be removed to prolong the operational life and enhance the performance of the heat-generating devices 21-25. One of ordinary skill in the art would appreciate that, although multiple heat-generating devices are shown in FIGS. 7 and 8, in various embodiments the number of heat-generating devices may be more or less depending on the actual implementation.

Figure 9:
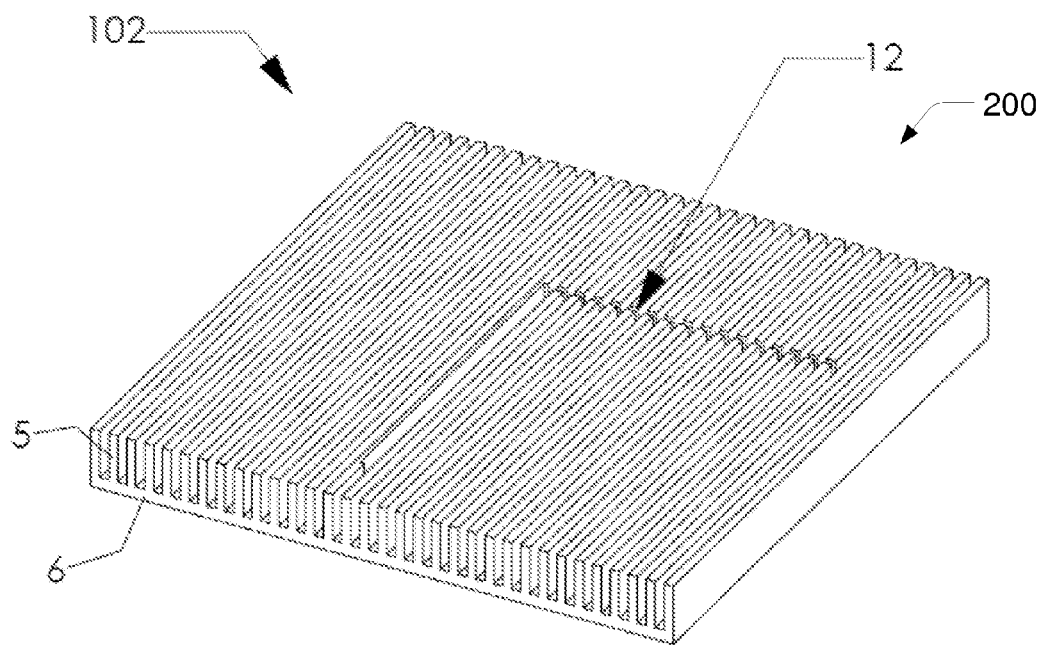
FIG. 9 is a perspective top view of a device in accordance with another embodiment of the present disclosure.
Figure 10:
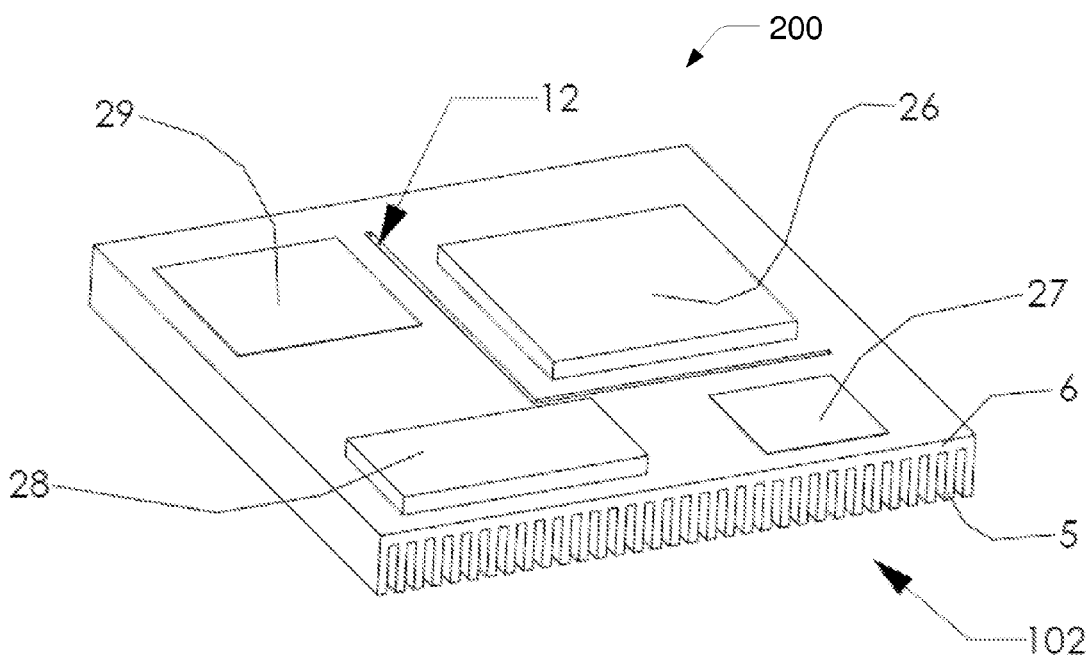
FIG. 10 is a perspective bottom view of the device of FIG. 9.

FIGS. 9 and 10 illustrate a device 200 in accordance with another embodiment of the present disclosure. The following description refers to FIGS. 9 and 10.

The device 200 and the device 100 are similar in many ways. In the interest of brevity, detailed description of differences between the device 200 and the device 100 is provided herein while similarity therebetween is not repeated. As shown in FIGS. 9 and 10, the device 200 includes a silicon-based heat-dissipation device 102 that has a base portion 6 and a protrusion portion 5. The base portion 6 has a first primary side and a second primary side opposite the first primary side. The protrusion portion 5 is on the first primary side of the base portion 6 and protrudes therefrom. The protrusion portion 5 may include multiple fins similar to those of the protrusion portion 1 of the silicon-based heat-dissipation device 101, and thus detailed description thereof is not repeated.

The silicon-based heat-dissipation device 102 includes a slit 12 on the base portion 6 that cuts off, or severs, a direct-line thermal coupling path via conduction through the base portion 6 between a first heat-generating device on one side of the slit 12 and a second heat-generating device on the other side of the slit 12. In one embodiment, the slit 12 is an L-shaped slit as shown in FIGS. 9 and 10. In other embodiments, instead of a slit, the base portion 6 includes a trench or groove on its first primary side or second primary side.

In the example shown in FIG. 10, each of heat-generating devices 26-29 is embedded in or physically coupled, mounted or otherwise attached to the second primary side of the base portion 6. As shown in FIG. 10, the heat-generating device 26 is on one side of the L-shaped slit 12 while the heat-generating devices 26-28 are on the other side the L-shaped slit 12. The slit 12 provides the function of severing a direct-line thermal coupling path via conduction through the base portion 6 between the heat-generating device 26 and each of the heat-generating devices 27-29. This way, the absolute temperature of each of the heat-generating device 27-29 can be lowered. This arrangement may be suitable, for example, when the heat-generating device 26 (e.g., a microprocessor) generates more heat than each of the heat-generating devices 27-29 during operation. The silicon-based heat-dissipation device 102 may be fabricated on the backside of an IC or SOI chip.

Metal heat sinks built with aluminum or copper are designed with its physical geometry of fins and base structure to efficiently dissipate heat into the surrounding of the heat sink by forced-air convection or natural convection. The optimum performance of a metal heat sink can be designed based on the density of the fins and the base structure. Advantageously, a heat sink built with silicon material in accordance with the present disclosure adds a distinctive advantage of a high-density fin design with very smooth surface finish. The present disclosure provides preferred design parameters, obtained from a designed experiment, that optimize the design of silicon-based heat-dissipation devices to provide an optimum performance of various embodiments of the silicon-based heat-dissipation devices in accordance with the present disclosure.

Various embodiments of the silicon-based heat-dissipation device of the present disclosure may be fabricated with high-density fin configuration, meaning many silicon fins are closely packed so that a large surface area is created to effectively dissipate heat into the surrounding by natural convection. On one hand, if the silicon fins are too densely packed, the air convection between the silicon fins would tend to fail to dissipate the heat. The present disclosure provides an optimum silicon fin spacing to efficiently dissipate the heat via natural convection. On the other hand, a loose silicon fin configuration improves the effectiveness of natural convection, but the surface area of the loose silicon fin configuration would tend to have degraded thermal performance.

Through numerous experiments, inventors of the present disclosure discovered that an optimal range of the silicon fin surface area to heat loading is in a range of approximately 400 $mm^2$/watt to 2000 $mm^2$/watt. If the silicon fin surface area per heat loading is below 400 $mm^2$/watt then the silicon-based heat-dissipation device would not provide much advantage over a conventional copper or aluminum heat sink having a loose fin configuration. If the silicon fin surface area per heat loading is above 2000 $mm^2$/watt with a sufficient separation between silicon fins, the silicon fins may become too thin for mechanical stability and reliability of the silicon fins. At the surface power level of 2000 $mm^2$/watt a thickness of a silicon fin below 50 microns (μm) may be structurally too fragile.

In one experiment, the pitch of the silicon fins (i.e., the distance from the tip of a silicon fin to the tip of an immediately adjacent silicon fin, or the distance from one side of a silicon fin to the same side of an immediately adjacent silicon fin) is fixed at 600 μm and the thickness of each silicon fin is varied to be 225 μm, 300 μm or 375 μm. The silicon fins are etched to be approximately 475 μm deep in 525 μm-thick mono-crystal silicon with the above-listed various silicon fin thicknesses. The total surface area of the fin structure is not changed with the silicon fins having the above-listed silicon fin thicknesses. The experiment test result shows very slight change in the thermal performance of these designs and the actual tested silicon heat sink structure with the temperature loaded with 0.5 watt as shown in the Table 1 below.

| Pitch (P1) in mm | Thickness (X1) in mm | Silicon Heat Sink Dimension W × L × H (in mm) | Gap (Y1) in mm | Surface Area per 1 watt of heat loading ($mm^2$/watt) | Silicon Heat Sink-Temperature (° C.) |
|---|---|---|---|---|---|
| 0.6 | 0.225 | 10 × 10 × 0.525 | 0.375 | 520 | 65.6 |
| 0.6 | 0.300 | 10 × 10 × 0.525 | 0.300 | 520 | 65.8 |
| 0.6 | 0.375 | 10 × 10 × 0.525 | 0.225 | 520 | 64.3 |

In another experiment, the thickness of each silicon fin is fixed at 150 μm and the pitch between every two neighboring silicon fins is varied to be 300 μm, 600 μm, 900 μm or 1200 μm. In this case the silicon fin density (same as surface area) is changed dramatically by the pitch. The experiment shows the temperature of silicon heat sink dramatically drops as the surface area per power reaches above 400 $mm^2$/watt and the temperature drops down slowly after 400 $mm^2$/watt level, with the drop in temperature flattens out around 2000 $mm^2$/watt. Table 2 below shows the design parameters in this experiment.

| Pitch (P1) in mm | Thickness (X1) in mm | Silicon Heat Sink Dimension W × L × H (in mm) | Gap (Y1) in mm | Surface Area per 1 watt of heat loading ($mm^2$/1 watt) | Silicon Heat Sink Temperature (° C.) |
|---|---|---|---|---|---|
| 0.300 | 0.05 | 10 × 10 × 1.2 | 0.25 | 1124 | 72.0 |
| 0.300 | 0.15 | 10 × 10 × 0.525 | 0.15 | 860 | 77.5 |
| 0.600 | 0.15 | 10 × 10 × 0.525 | 0.45 | 520 | 77.4 |
| 1.200 | 0.15 | 10 × 10 × 0.525 | 1.05 | 360 | 90.3 |

Figure 11:
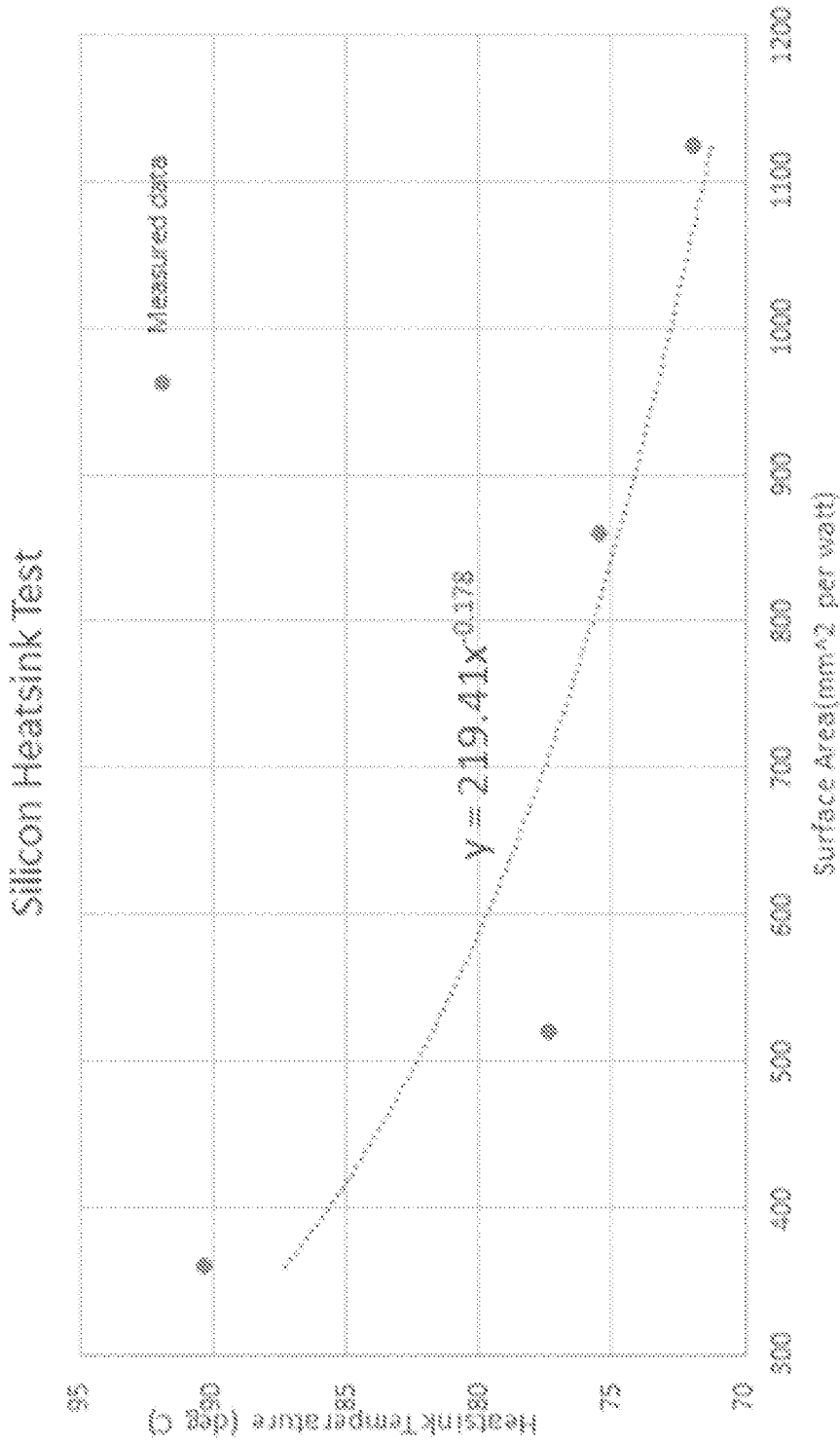
FIG. 11 is a chart showing the surface area of a silicon fin structure of a silicon-based heat-dissipation device versus the temperature of the silicon-based heat-dissipation device.

FIG. 11 is a chart showing the surface area of a silicon fin structure of a silicon-based heat-dissipation device versus the temperature of the silicon-based heat-dissipation device. As shown in FIG. 11, temperature of the silicon heat sink drops relatively fast until approximately 400 $mm^2$/watt and the fitted curve flattens out around 1200 $mm^2$/watt and beyond. Thus, the optimum design of the silicon-based heat-dissipation device may be estimated to be in the range of approximately 400 $mm^2$/watt to 2000 $mm^2$/watt for a given power loading of a heat-generating device from which the silicon-based heat-dissipation device is to remove heat. That is, for every 1 watt of power loading of the heat-generating device from which heat is to be dissipated, optimally the surface area of the silicon-based heat-dissipation device is in the range of approximately 400 $mm^2$/watt to 2000 $mm^2$/watt.

Figure 12:
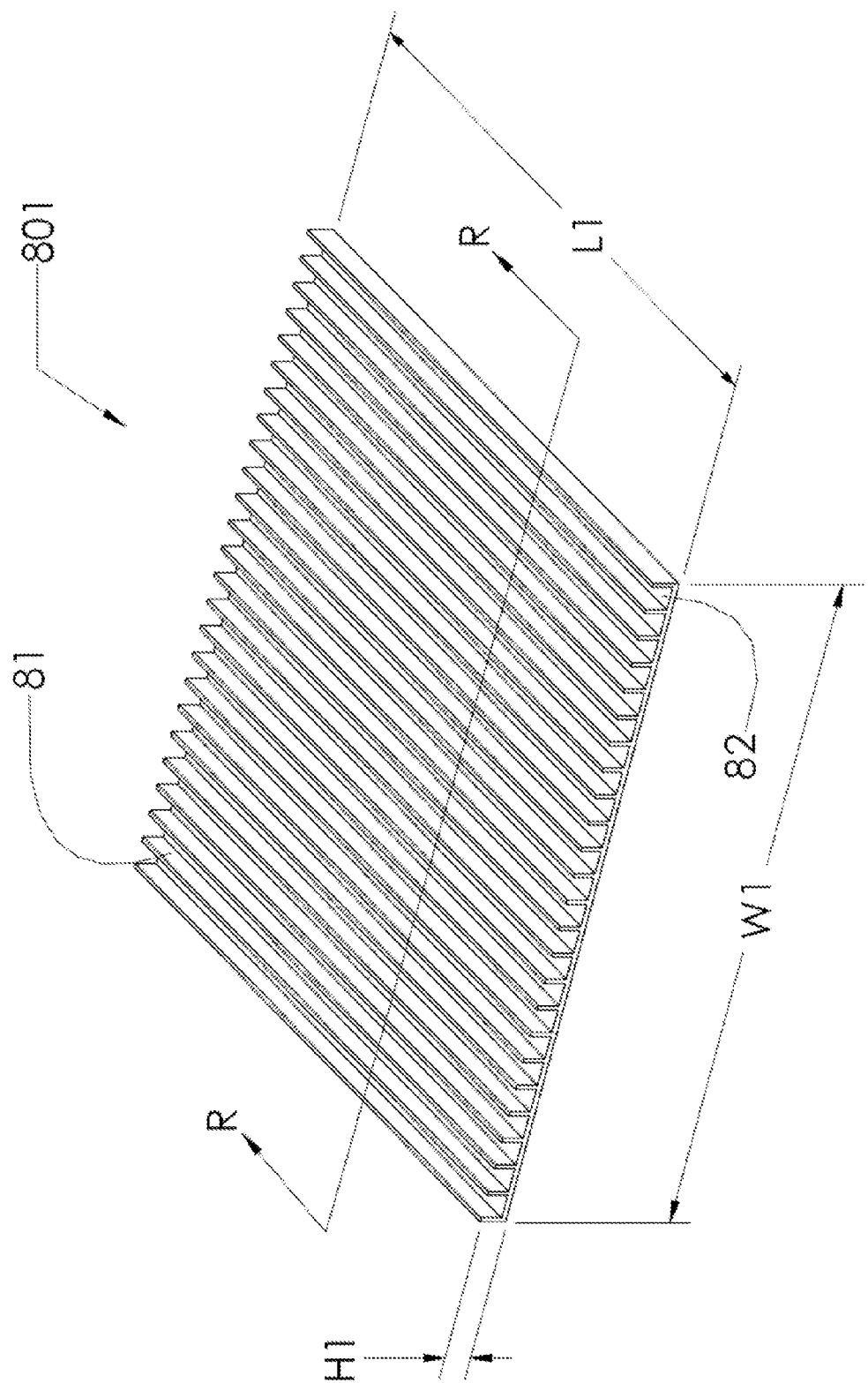
FIG. 12 is a perspective view of a heat-dissipation device in accordance with another embodiment of the present disclosure.
Figure 13:
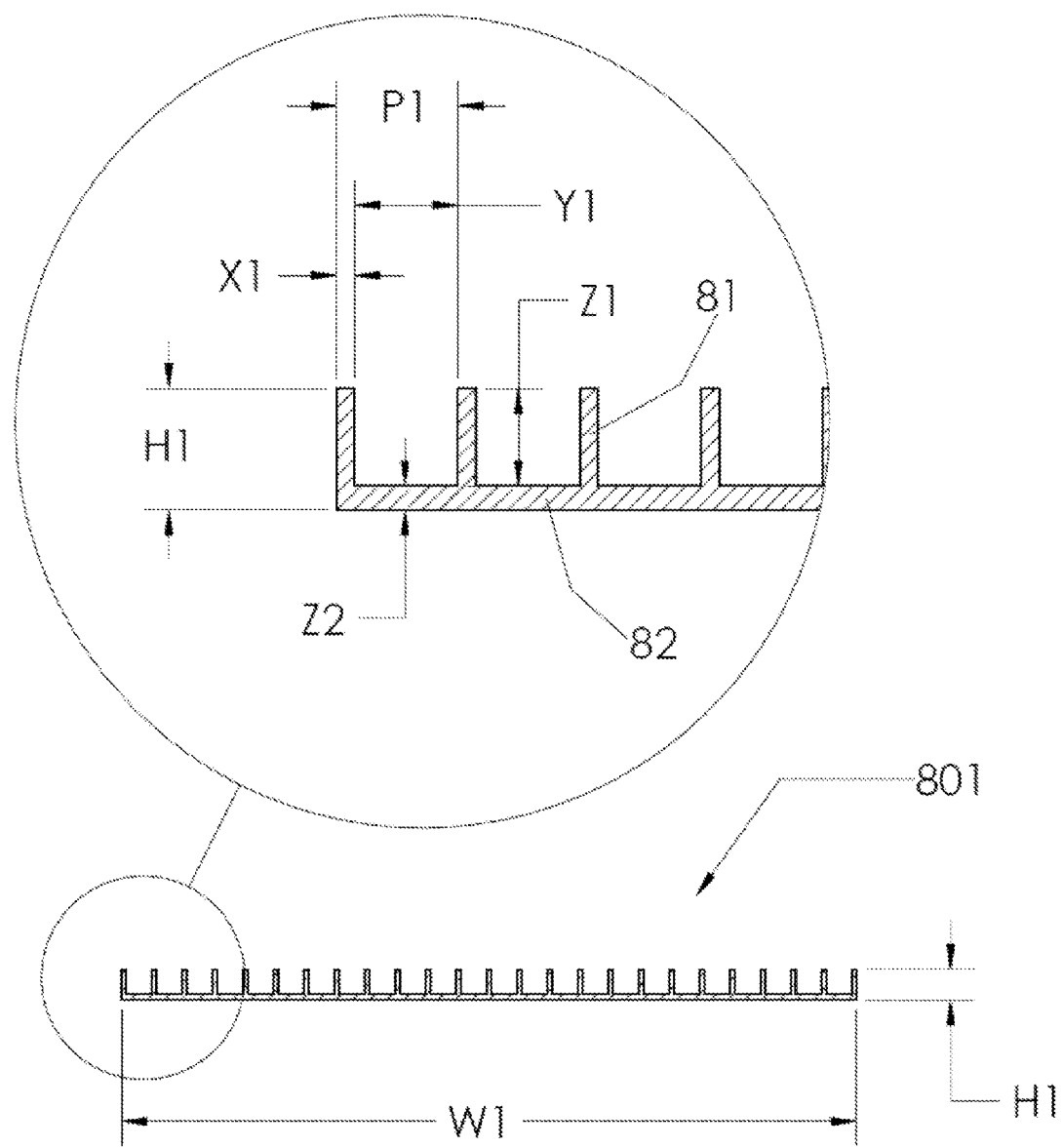
FIG. 13 is a partial cross-sectional view of the heat-dissipation device of FIG. 12.

FIG. 12 is a perspective view of a silicon-based heat-dissipation device 801 in accordance with another embodiment of the present disclosure. FIG. 13 is a partial cross-sectional view of the silicon-based heat-dissipation device 801.

As shown in FIGS. 12 and 13, silicon-based heat-dissipation device 801 utilizes fin structure 51 with dimensions of width W1, length L1 and height H1, and a volume defined by W1×L1×H1. Silicon-based heat-dissipation device 801 includes a silicon protrusion portion 81 and a silicon base portion 82, with protrusion portion 81 on and protruding from a first primary side of base portion 82. Protrusion portion 81 includes a number of fins and has a height Z1. Each fin of protrusion portion 81 has a thickness X1. Base portion 82 has a thickness of Z2. The total thickness of silicon-based heat-dissipation device 801 is H1, with H1=Z1+Z2. The fins of protrusion portion 81 has a pitch P1 and a gap Y1 between every two immediately adjacent or neighboring fins of protrusion portion 81.

For efficient heat dissipation by natural convection, gap Y1 needs to be sufficiently wide enough for air to flow through. However, the narrower the gap Y1 the more the surface area of silicon-based heat-dissipation device 801 would be, but the thermal performance of silicon-based heat-dissipation device 801 would be reduced. The optimum performance of silicon-based heat-dissipation device 801 for natural convection depends on a proper thickness X1 and gap Y1 of the fins of protrusion portion 81 as well as the thickness Z2 of base portion 82. In one embodiment, the thickness X1 of each fin of protrusion portion 81 is in the range of 0.030 mm to 1 mm depending on the size of silicon-based heat-dissipation device 801. In one embodiment, the aspect ratio (Z1/Y1) is greater than 1. In one embodiment, the ratio of Z1/Z2 is greater than 1.

One metric for thermal performance of a silicon heat sink, such as silicon-based heat-dissipation device 801 for example, is found to be expressed in terms of a surface area per loaded heat power. Referring to the chart in FIG. 11, a silicon heat sink according to the present disclosure performs very effectively for values greater than 400 mm$^2$/watt. For instance, for any IC chip dissipating 1 watt of heat, the surface area of the silicon heat sink (e.g., silicon-based heat-dissipation device 801) is preferably greater than 400 mm$^2$. Accordingly, silicon-based heat-dissipation device 801 is preferably built to satisfy the following dimensional requirements. The thickness X1 of each fin of protrusion portion 81 satisfies the requirement of 0.030 mm<X1<1 mm. The ratio of Z1/Y1 satisfies the requirement of 0.5<Z1/Y1. The ratio of Z1/Z2 satisfies the requirement of Z1/Z2>0.5. For example, for a 1-watt IC chip silicon-based heat-dissipation device 801 may be built with the following dimensions: X1=0.05 mm, Y1=0.250 mm, Z1=0.450 mm, Z2=0.050 mm, L1=15 mm, W1=15 mm and H1=0.5 mm. With pitch P1 being 0.3 mm, this design would have almost a quantity of 50 fins in the protrusion portion 81 configured in the total size of 15 mm×15 mm×0.5 mm of silicon-based heat-dissipation device 801. The surface area of the topside of protrusion portion 81 is calculated to be 900 mm$^2$ and it meets all requirements of the design of silicon-based heat-dissipation device 801 that is empirically optimized. Preferably, regardless of the power loading of the heat-generating device silicon-based heat-dissipation device 801 is attached to, dimensional parameters of silicon-based heat-dissipation device 801 satisfy the requirement of being in the range of approximately 400 mm$^2$/watt to 2000 mm$^2$/watt for a given power loading of a heat-generating device from which the silicon heat sink is to remove heat.

Figure 14:
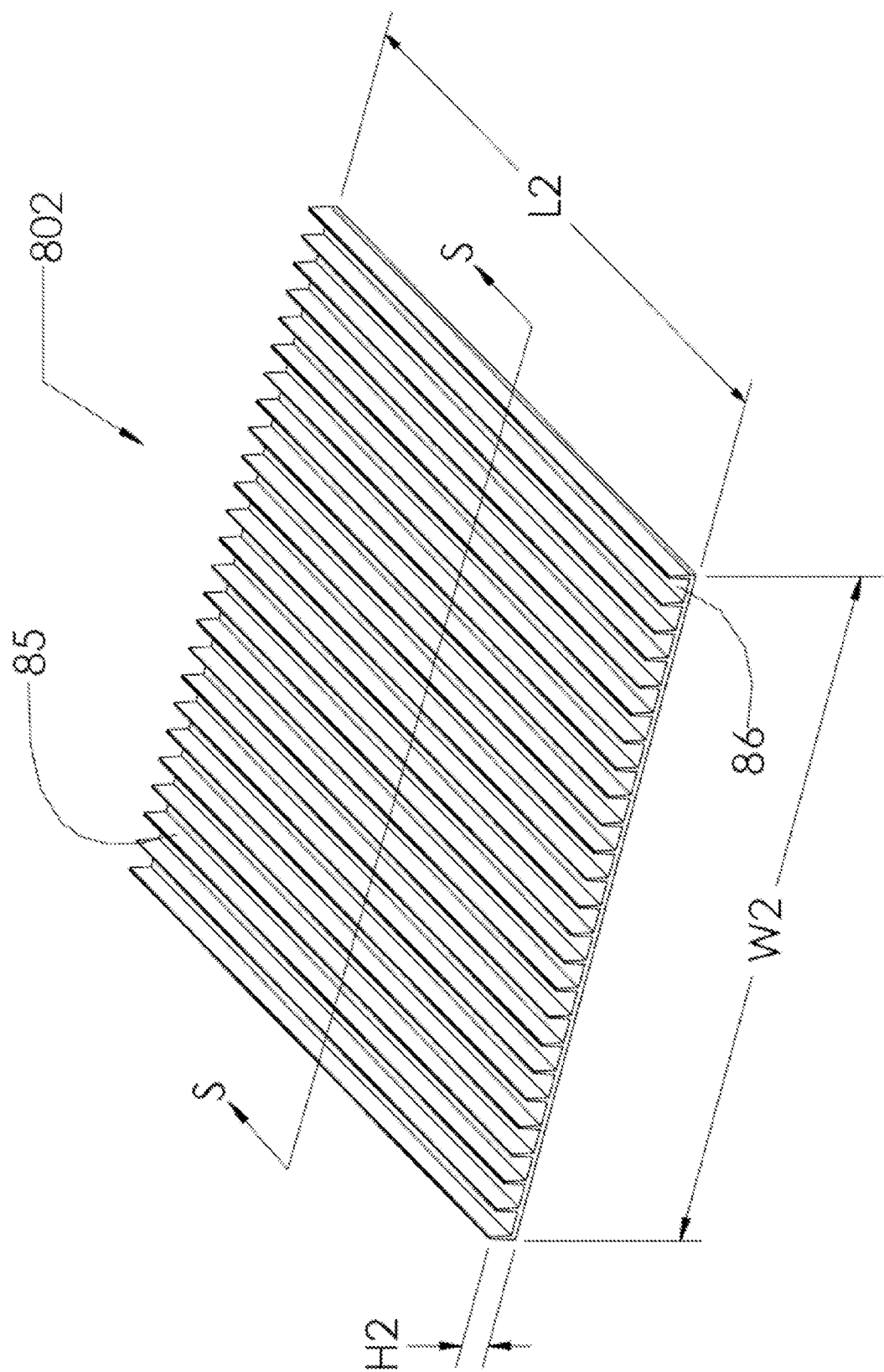
FIG. 14 is a perspective view of a heat-dissipation device in accordance with yet another embodiment of the present disclosure.
Figure 15:
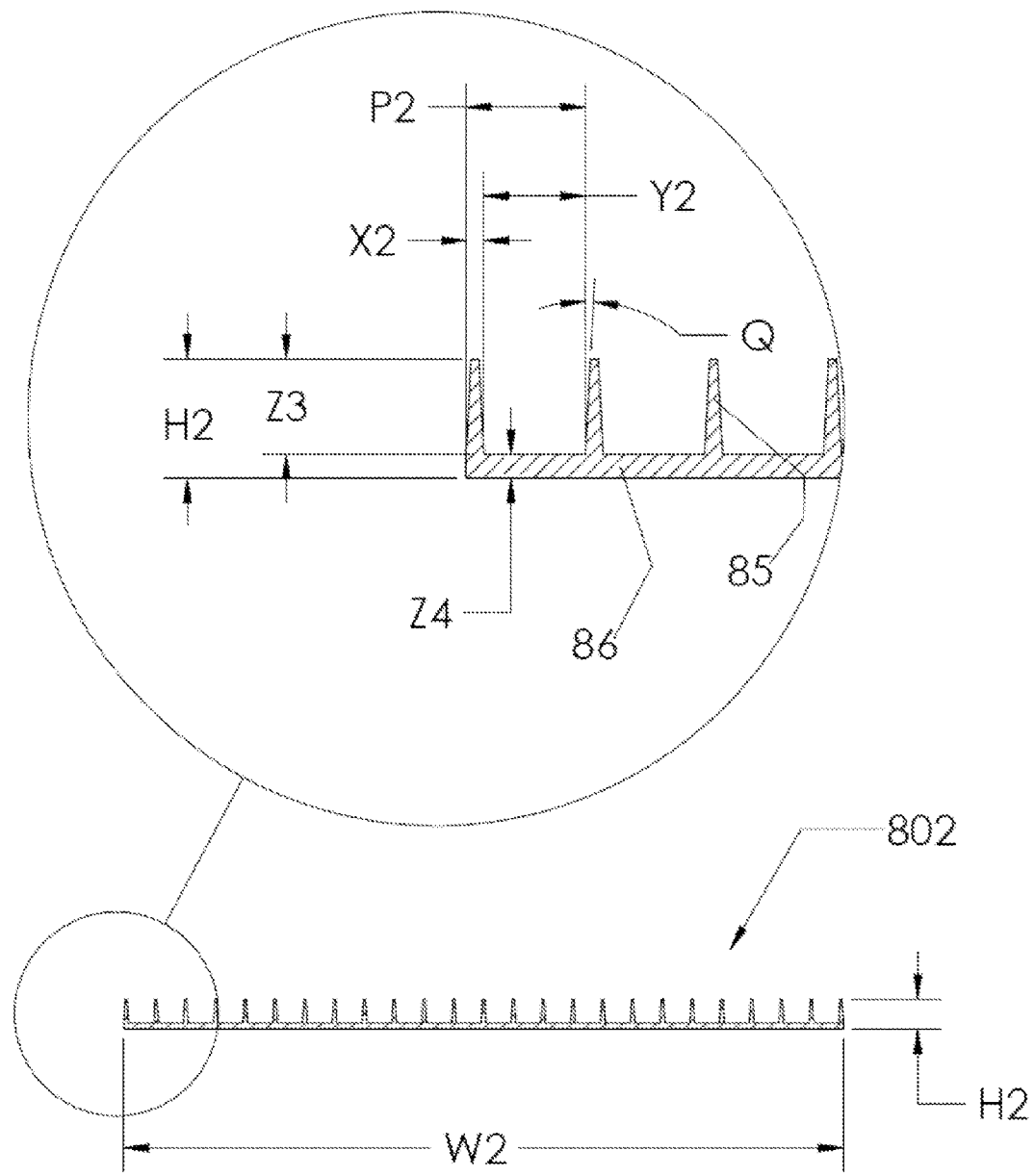
FIG. 15 is a partial cross-sectional view of the heat-dissipation device of FIG. 14.

FIG. 14 is a perspective view of a silicon-based heat-dissipation device 802 in accordance with another embodiment of the present disclosure. FIG. 15 is a partial cross-sectional view of the silicon-based heat-dissipation device 802.

As shown in FIGS. 14 and 15, silicon-based heat-dissipation device 802 utilizes fin structure 52 with dimensions of width W2, length L2 and height H2, and a volume defined by W2×L2×H2. Silicon-based heat-dissipation device 802 includes a silicon protrusion portion 85 and a silicon base portion 86, with protrusion portion 85 on and protruding from a first primary side of base portion 86. Protrusion portion 85 includes a number of fins and has a height Z3. Each fin of protrusion portion 81 is a tapered fin, with a thickness X2 at its base and a smaller thickness at its distal end or tip. The amount of taper of each fin is measured by a tapered angle Q between the tapered surface of the fin and a normal line perpendicular to a horizontal plane defined by the first primary side of base portion 86 from which protrusion portion 85 protrudes out, as shown in FIG. 15. With tapered fins, silicon-based heat-dissipation device 802 has a slightly improved thermal performance compared to that of silicon-based heat-dissipation device 801 due to a better convection property under natural convection and forced-air convection. Preferably, the tapered angle Q is not too large and. In one embodiment, the tapered angle Q is less than or equal to 5 degrees. In one embodiment, the tapered angle Q is greater than or equal to 3 degrees and less than or equal to 5 degrees, or 3 degrees Q 5 degrees. Base portion 86 has a thickness of Z4. The total thickness of silicon-based heat-dissipation device 802 is H2, with H2=Z3+Z4. The fins of protrusion portion 85 has a pitch P2 and a gap Y2 between every two immediately adjacent or neighboring fins of protrusion portion 85.

For efficient heat dissipation by natural convection, gap Y2 needs to be sufficiently wide enough for air to flow through. However, the narrower the gap Y2 the more the surface area of silicon-based heat-dissipation device 802 would be, but the thermal performance of silicon-based heat-dissipation device 802 would be reduced. The optimum performance of silicon-based heat-dissipation device 801 for natural convection depends on a proper thickness X1 and gap Y2 of the fins of protrusion portion 82 as well as the thickness Z4 of base portion 86. In one embodiment, the thickness X2 of each fin of protrusion portion 85 is in the range of 0.030 mm to 1 mm depending on the size of silicon-based heat-dissipation device 802. In one embodiment, the aspect ratio (Z3/Y2) is greater than 1. In one embodiment, the ratio of Z3/Z4 is greater than 1. Preferably, regardless of the power loading of the heat-generating device silicon-based heat-dissipation device 802 is attached to, dimensional parameters of silicon-based heat-dissipation device 801 satisfy the requirement of being in the range of approximately 400 mm$^2$/watt to 2000 mm$^2$/watt for a given power loading of a heat-generating device from which the silicon heat sink is to remove heat.

Figure 16:
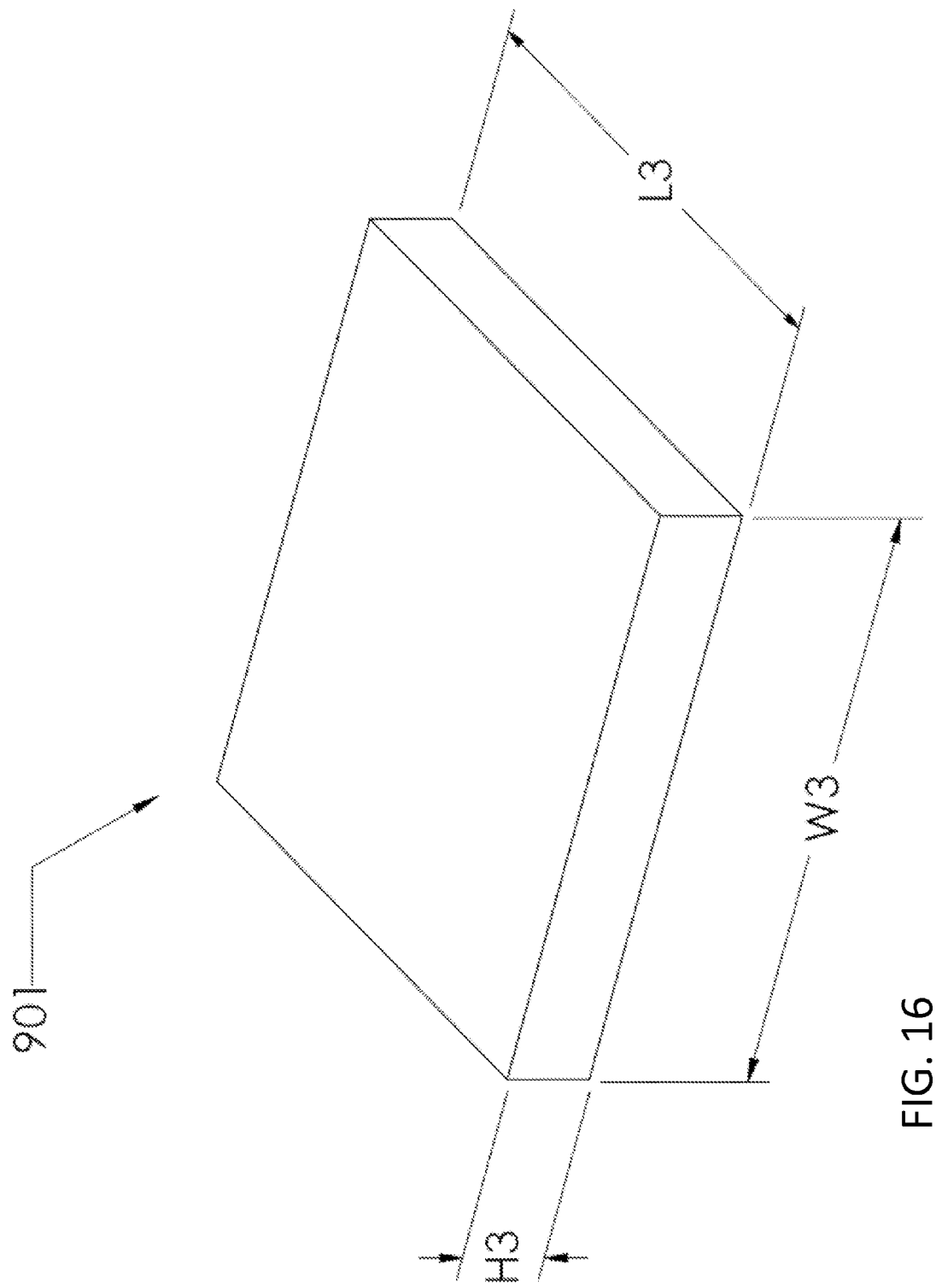
FIG. 16 is a perspective view of a blank silicon substrate used to fabricate a heat-dissipation device in accordance with an embodiment of the present disclosure.
Figure 17:
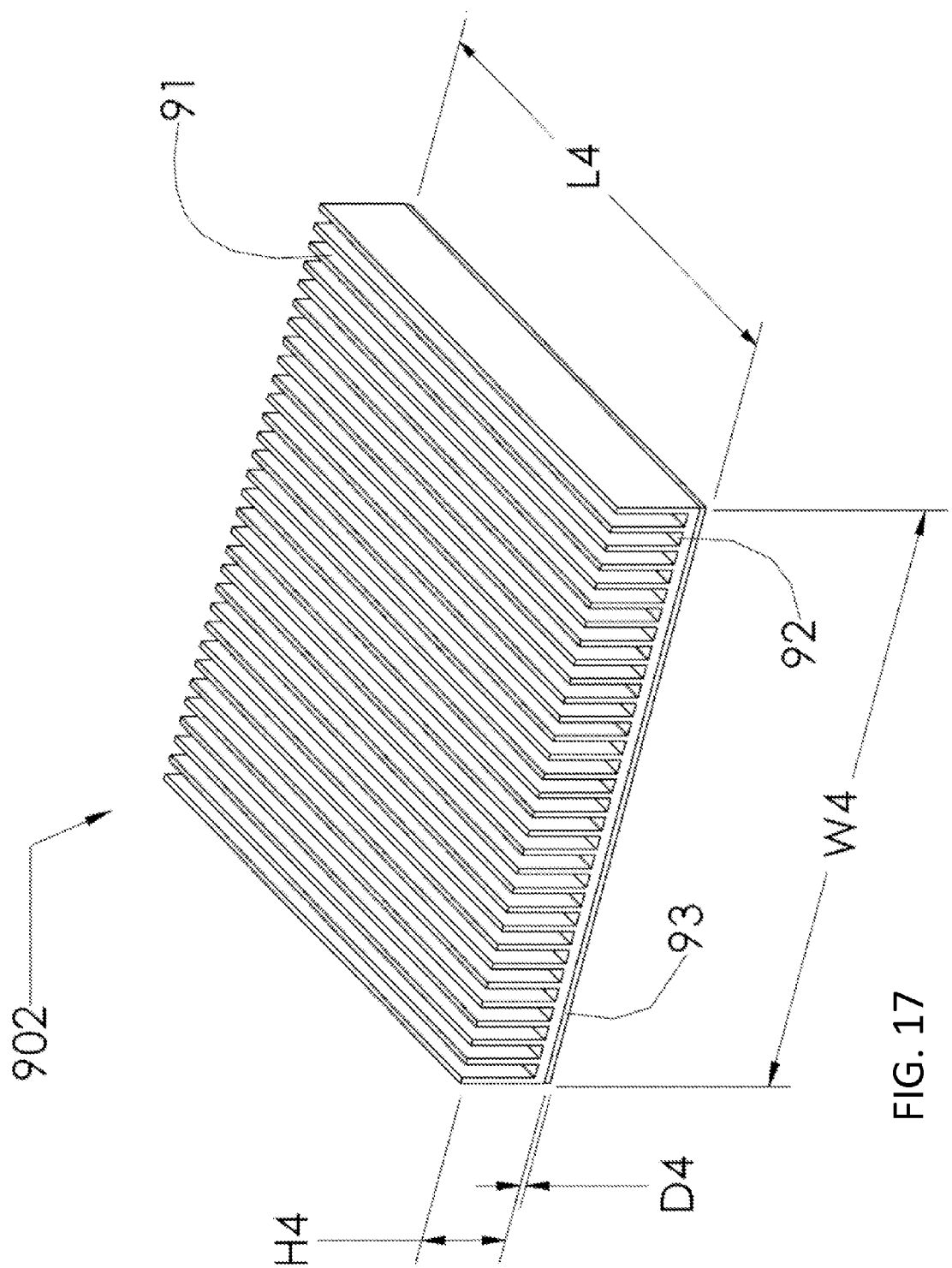
FIG. 17 is a top perspective view of a heat-dissipation device utilizing a silicon substrate etched with fins in accordance with an embodiment of the present disclosure.
Figure 18:
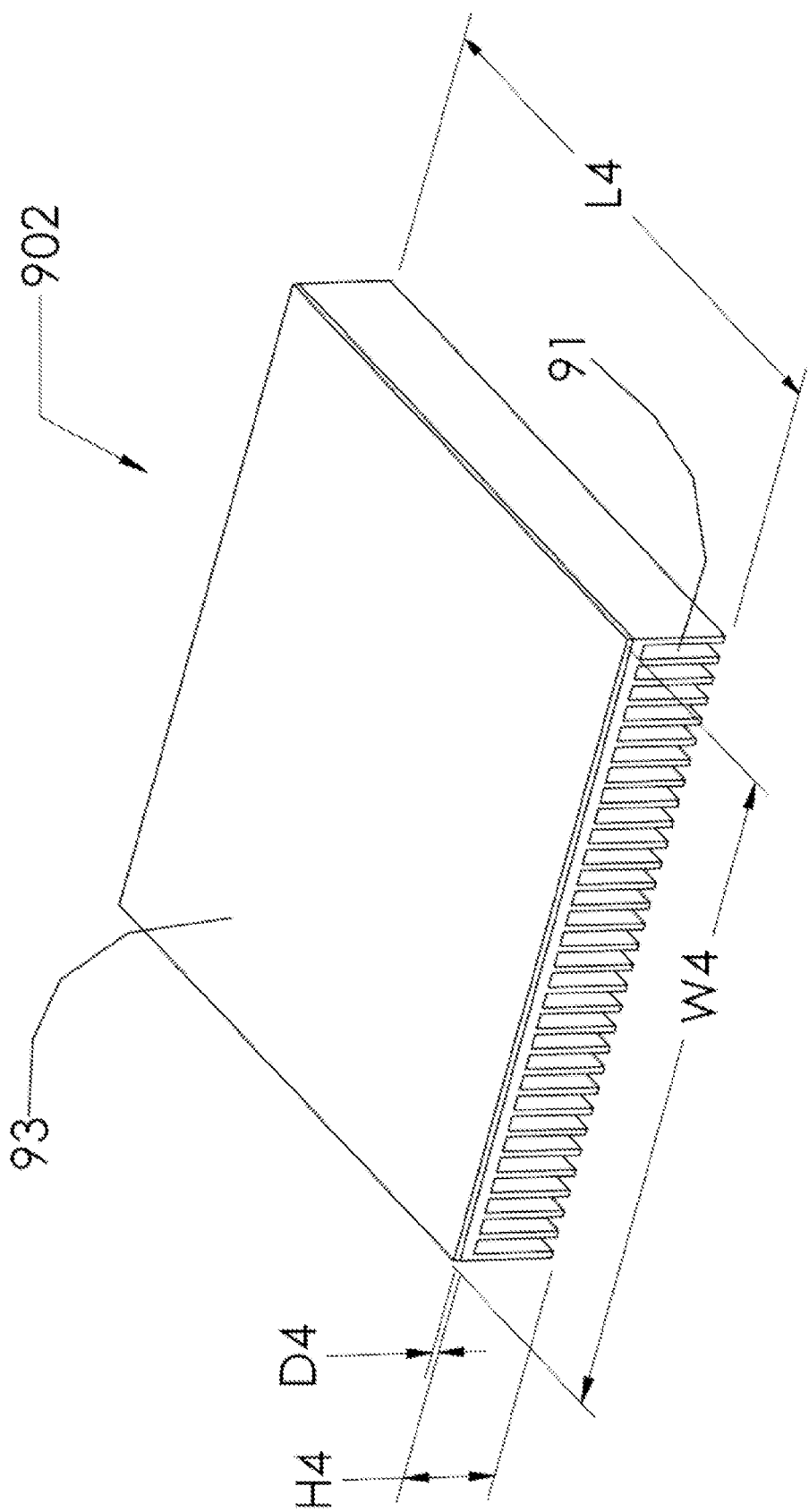
FIG. 18 is a bottom perspective view of the heat-dissipation device of FIG. 17.

FIG. 16 is a perspective view of a blank silicon substrate 901 used to fabricate a heat-dissipation device in accordance with an embodiment of the present disclosure. FIG. 17 is a top perspective view of a silicon-based heat-dissipation device 902 utilizing a silicon substrate etched with fins in accordance with an embodiment of the present disclosure. FIG. 18 is a bottom perspective view of silicon-based heat-dissipation device 902.

As shown in FIG. 16, blank silicon substrate 901 has dimensions of width W3, length L3 and height H3, and a volume defined by W3×L3×H3. Blank silicon substrate 901 may be made of single-crystal silicon. Blank silicon substrate 901 may be used to fabricate, e.g., by wet etch or dry etch, the silicon-based heat-dissipation device 902 of FIGS. 17 and 18. Silicon-based heat-dissipation device 902 may utilize fin structure 51, 52 or 53, although for simplicity fin structure 51 is depicted in silicon-based heat-dissipation device 902 in FIGS. 17 and 18. Moreover, silicon-based heat-dissipation device 902 may represent any of silicon-based heat-dissipation devices 101, 102, 801 and 802 described above. That is, some or all of the features described herein regarding silicon-based heat-dissipation device 902 may be applicable to any of silicon-based heat-dissipation devices 101, 102, 801 and 802.

As shown in FIGS. 17 and 18, silicon-based heat-dissipation device 902 has dimensions of width W4, length L4 and height H4, and a volume defined by W4×L4×H4. In the case that silicon-based heat-dissipation device 902 is formed by etching the blank silicon substrate 901 of FIG. 16, the dimensions W4, L4 and H4 may be the same as dimensions W3, L3 and H3. Silicon-based heat-dissipation device 902 includes a silicon protrusion portion 91 and a silicon base portion 92, with protrusion portion 91 on and protruding from a first primary side of base portion 92. Protrusion portion 91 includes a number of fins.

With reference to FIGS. 16-18, another metric that defines the dimensional requirements to achieve optimum thermal performance relates to the amount of surface area of the fins of protrusion portion 91 to the footprint area of blank silicon substrate 901, which is used to fabricate silicon-based heat-dissipation device 902. Given q=hAΔT, the increase in surface area due to the etching of blank silicon substrate 901 to form the fins of protrusion portion 91 of silicon-based heat-dissipation device 902 is preferably in a range of approximately 500 mm$^2$ to 4000 mm$^2$ surface area of cooling fins per 10 mm×10 mm silicon blank surface area. That is, preferably, the protrusion portion 91 of silicon-based heat-dissipation device 902 has a surface area of approximately 5 mm$^2$ to 40 mm$^2$ surface area of cooling fins per 1 mm$^2$ surface area of blank silicon substrate 901. This is applicable to both natural convection and forced-air convection. Existing fabrication technologies of metal heat sinks can achieve up to about 4 to 5 mm$^2$ surface area of cooling fins per 1 mm$^2$ surface area of bulk material. In comparison, embodiments of the present disclosure can achieve 5 mm$^2$ to 40 mm$^2$ surface area of fins per 1 mm$^2$ surface area of a blank silicon substrate from which the silicon-based heat-dissipation device is made.

In one embodiment, silicon-based heat-dissipation device 902 has the following dimensions: thickness of each fin of protrusion portion 91=50 μm, pitch=100 μm, thickness of base portion 92 of=100 μm, and height H4=2000 μm. Accordingly, the calculated total surface area of silicon-based heat-dissipation device 902 is 4061 mm$^2$. With the blank silicon substrate 901 having the dimensions of 10 mm×10 mm×2 mm, the calculated total surface area of blank silicon substrate 901 is 280 mm$^2$. This design has a metric of 14.5 mm$^2$ per 1 mm$^2$ silicon blank surface area.

In another embodiment, silicon-based heat-dissipation device 902 has the following dimensions: thickness of each fin of protrusion portion 91=50 μm, pitch=2000 μm, thickness of base portion 92 of=1950 μm, and height H4=2000 μm. Accordingly, the calculated total surface area of silicon-based heat-dissipation device 902 is 283 mm$^2$. With the blank silicon substrate 901 having the dimensions of 10 mm×10 mm×2 mm, the calculated total surface area of blank silicon substrate 901 is 280 mm$^2$. This design has a metric of 1.0 mm$^2$ per 1 mm$^2$ silicon blank surface area.

Optionally, with reference to FIGS. 17 and 18, to help quickly spread heat at base portion 92 of silicon-based heat-dissipation device 902, a thermally-conductive layer 93 may be coated or deposited on a second primary side of base portion 92 opposite the first primary side thereof. Thermally-conductive layer 93 may be a metal layer or a non-metal layer. For example, thermally-conductive layer 93 may be a copper layer or an aluminum layer. Alternatively, thermally-conductive layer 93 may be a layer of diamond, graphite, aluminum nitride, or carbon nanotubes. Thermally-conductive layer 93 may enhance the thermal performance of silicon-based heat-dissipation device 902 and effectively reduce the thickness of silicon base 92. For example, one or more heat-generating devices, such as heat-generating devices 21-25 for example, may be embedded in or physically coupled, mounted or otherwise attached to thermally-conductive layer 93.

Thermal modeling indicates adding a layer of thick metal layer, such as thermally-conductive layer 93, may improve the thermal performance of silicon-based heat-dissipation device 902. Note that it is not practical in current electrical plating process to have a large thickness for thermally-conductive layer 93 or to maintain the flatness of thermally-conductive layer 93. In one embodiment, the thickness of thermally-conductive layer 93 is in a range of approximately 3 μm to 30 μm to optimize the thermal performance of silicon-based heat-dissipation device 902.

In summary, according to one aspect of the present disclosure, an apparatus may include a silicon-based heat-dissipation device. The silicon-based heat-dissipation device may include a base portion and a protrusion portion. The base portion may have a first primary side and a second primary side opposite the first primary side. The protrusion portion may be on the first primary side of the base portion and may protrude therefrom. The second primary side of the base portion may be configured to have one or more heat-generating devices embedded therein or physically coupled thereto such that at least a portion of heat generated by the one or more heat-generating devices is dissipated to the silicon-based heat-dissipation device by conduction. The silicon-based heat-dissipation device may have a surface area such that, for every 1 watt of power loading of the one or more heat-generating devices, the surface area of the silicon-based heat-dissipation device is in a range of approximately 400 mm$^2$/watt to 2000 mm$^2$/watt.

In at least one embodiment, the base portion may include a slit that communicatively connects the first primary side and the second primary side of the base portion.

In at least one embodiment, when each of more than one heat-generating devices is embedded in or physically coupled to the base portion, at least a first heat-generating device of the more than one heat-generating devices may be on a first side of the slit and at least a second heat-generating device of the more than one heat-generating devices may be on a second side of the slit opposite the first side of the slit such that the slit severs a direct-line thermal coupling path via conduction through the base portion between the first and the second heat-generating devices.

In at least one embodiment, the slit may include an L-shaped slit.

In at least one embodiment, the protrusion portion of the silicon-based heat-dissipation device may include a plurality of fins.

In at least one embodiment, the plurality of fins may include a plurality of straight fins.

In at least one embodiment, a ratio of a height of the fins, measured from the first primary side of the base portion in a direction perpendicular to the first primary side, to a thickness of each of the fins, measured across a respective one of the fins in a direction parallel to the first primary side of the base portion, may be greater than 5:1.

In at least one embodiment, a ratio of a height of the fins, measured from the first primary side of the base portion in a direction perpendicular to the first primary side, to a thickness of the base portion, measured across the base portion in a direction parallel to the first primary side of the base portion, may be greater than 5:1.

In at least one embodiment, a spacing between every two fins of the fins, measured between respective two fins of the fins in a direction parallel to the first primary side of the base portion, may be greater than or equal to a thickness of each of the fins, measured across a respective one of the fins in the direction parallel to the first primary side of the base portion.

In at least one embodiment, the plurality of fins may include a plurality of tapered fins.

In at least one embodiment, at least a first fin of the tapered fins may have a tapered angle between a surface of the first fin and a normal line perpendicular to a horizontal plane defined by the first primary side of the base portion. The tapered angle may be less than or equal to 5 degrees.

In at least one embodiment, the apparatus may further include a copper layer coupled to the second primary side of the base portion with a thickness of the copper layer being in a range of approximately 3 µm to 30 µm.

In at least one embodiment, the apparatus may further include one or more integrated circuits embedded in the second primary side of the base portion or one or more electrically-driven devices physically coupled to the second primary side of the base portion. At least a first one of the one or more integrated circuits or the one or more electrically-driven devices may be on a first side of the slit. At least a second one of the one or more integrated circuits or the one or more electrically-driven devices may be on a second side of the slit opposite the first side of the slit. The slit may sever a direct-line thermal coupling path via conduction through the base portion between the first one of the one or more integrated circuits or the one or more electrically-driven devices and the second one of the one or more integrated circuits or the one or more electrically-driven devices.

In at least one embodiment, the silicon-based heat-dissipation device may be made from a blank silicon substrate of single-crystal silicon. The protrusion portion may have a surface area of approximately 5 mm$^2$ to 40 mm$^2$ surface area of the protrusion portion per 1 mm$^2$ surface area of a blank silicon substrate from which the silicon-based heat-dissipation device is made.

According to another aspect, an apparatus may include a silicon-based heat-dissipation device. The silicon-based heat-dissipation device may include a base portion and a protrusion portion. The second primary side may be configured to have one or more heat-generating devices embedded therein or physically coupled thereto. The base portion may have a first primary side and a second primary side opposite the first primary side. The protrusion portion may be on the first primary side of the base portion and protruding therefrom. The protrusion portion may include a plurality of fins. Each of at least two immediately adjacent fins of the fins of the protrusion portion may have a tapered profile in a cross-sectional view with a first width near a distal end of the respective fin being less than a second width at a base of the respective fin near the base portion of the heat-dissipation device. The silicon-based heat-dissipation device may have a surface area such that, for every 1 watt of power loading of the one or more heat-generating devices, the surface area of the silicon-based heat-dissipation device is in a range of approximately 400 mm$^2$/watt to 2000 mm$^2$/watt.

In at least one embodiment, the second primary side of the base portion may be configured to have one or more heat-generating devices embedded therein or physically coupled thereto such that at least a portion of heat generated by the one or more heat-generating devices is dissipated to the silicon-based heat-dissipation device by conduction.

In at least one embodiment, at least a first fin of the tapered fins may have a tapered angle between a surface of the first fin and a normal line perpendicular to a horizontal plane defined by the first primary side of the base portion. The tapered angle may be less than or equal to 5 degrees.

In at least one embodiment, the apparatus may further include a copper layer coupled to the second primary side of the base portion with a thickness of the copper layer being in a range of approximately 3 µm to 30 µm.

In at least one embodiment, the apparatus may further include one or more integrated circuits embedded in the second primary side of the base portion or one or more electrically-driven devices physically coupled to the second primary side of the base portion. The base portion may include a slit that communicatively connects the first primary side and the second primary side of the base portion. At least a first one of the one or more integrated circuits or the one or more electrically-driven devices may be on a first side of the slit. At least a second one of the one or more integrated circuits or the one or more electrically-driven devices may be on a second side of the slit opposite the first side of the slit. The slit may sever a direct-line thermal coupling path via conduction through the base portion between the first one of the one or more integrated circuits or the one or more electrically-driven devices and the second one of the one or more integrated circuits or the one or more electrically-driven devices.

In at least one embodiment, the silicon-based heat-dissipation device may be made from a blank silicon substrate of single-crystal silicon. The protrusion portion may have a surface area of approximately 5 mm$^2$ to 40 mm$^2$ surface area of the fins per 1 mm$^2$ surface area of a blank silicon substrate from which the silicon-based heat-dissipation device is made.

Additional and Alternative Implementation Notes

The above-described embodiments pertain to a technique, design, scheme, device and mechanism for isolation of thermal ground for multiple heat-generating devices on a substrate. Although the embodiments have been described in language specific to certain applications, it is to be understood that the appended claims are not necessarily limited to the specific features or applications described herein. Rather, the specific features and applications are disclosed as example forms of implementing such techniques.

In the above description of example implementations, for purposes of explanation, specific numbers, materials configurations, and other details are set forth in order to better explain the invention, as claimed. However, it will be apparent to one skilled in the art that the claimed invention may be practiced using different details than the example ones described herein. In other instances, well-known features are omitted or simplified to clarify the description of the example implementations.

The described embodiments are intended to be primarily examples. The described embodiments are not meant to limit the scope of the appended claims. Rather, the claimed invention might also be embodied and implemented in other ways, in conjunction with other present or future technologies.

Moreover, the word "example" is used herein to mean serving as an example, instance, or illustration. Any aspect or design described herein as "example" is not necessarily to be construed as preferred or advantageous over other aspects or designs. Rather, use of the word example is intended to present concepts and techniques in a concrete fashion. The term "techniques," for instance, may refer to one or more devices, apparatuses, systems, methods, articles of manufacture, and/or computer-readable instructions as indicated by the context described herein.

As used in this application, the term "or" is intended to mean an inclusive "or" rather than an exclusive "or." That is, unless specified otherwise or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more," unless specified otherwise or clear from context to be directed to a singular form.

What is claimed is:

1. An apparatus, comprising:
 a silicon-based heat-dissipation device comprising:
  a base portion having a first primary side and a second primary side opposite the first primary side; and
  a protrusion portion on the first primary side of the base portion and protruding therefrom, the protrusion portion comprising a plurality of fins,
  wherein the second primary side of the base portion accommodates one or more heat-generating devices being embedded therein or physically coupled thereto to dissipate at least a portion of heat generated by the one or more heat-generating devices to the silicon-based heat-dissipation device by conduction,
  wherein the base portion comprises a slit that communicatively connects the first primary side and the second primary side of the base portion, at least one portion of the slit extending in a direction perpendicular to a direction in which the plurality of fins extend, and
  wherein at least one fin of the plurality of fins is dissected by the at least one portion of the slit into two separate fins.

2. The apparatus of claim 1, wherein the slit partially separates a first part of the base portion and a second part of the base portion such that the first part of the base portion is connected to the second part of the base portion near a first distal end of the slit and near a second distal end of the slit which is opposite the first distal end thereof.

3. The apparatus of claim 2, wherein, when each of more than one heat-generating devices is embedded in or physically coupled to the base portion, at least a first heat-generating device of the more than one heat-generating devices is on a first side of the slit and at least a second heat-generating device of the more than one heat-generating devices is on a second side of the slit opposite the first side of the slit such that the slit severs a direct-line thermal coupling path via conduction through the base portion between the first and the second heat-generating devices.

4. The apparatus of claim 1, wherein the slit comprises an L-shaped slit.

5. The apparatus of claim 1, wherein the plurality of fins comprises a plurality of straight fins.

6. The apparatus of claim 5, wherein a ratio of a height of the fins, measured from the first primary side of the base portion in a direction perpendicular to the first primary side, to a thickness of each of the fins, measured across a respective one of the fins in a direction parallel to the first primary side of the base portion, is greater than 5:1.

7. The apparatus of claim 5, wherein a ratio of a height of the fins, measured from the first primary side of the base portion in a direction perpendicular to the first primary side, to a thickness of the base portion, measured across the base portion in a direction perpendicular to the first primary side of the base portion, is greater than 5:1.

8. The apparatus of claim 5, wherein a spacing between every two fins of the fins, measured between respective two fins of the fins in a direction parallel to the first primary side of the base portion, is greater than or equal to a thickness of each of the fins, measured across a respective one of the fins in the direction parallel to the first primary side of the base portion.

9. The apparatus of claim 1, wherein the plurality of fins comprises a plurality of tapered fins.

10. The apparatus of claim 9, wherein at least a first fin of the tapered fins has a tapered angle between a surface of the first fin and a normal line perpendicular to a horizontal plane defined by the first primary side of the base portion, and wherein the tapered angle is less than or equal to 5 degrees and greater than 2 degrees.

11. The apparatus of claim 1, further comprising:
 a copper layer coupled to the second primary side of the base portion, a thickness of the copper layer being in a range of approximately 3 μm to 30 μm.

12. The apparatus of claim 2, further comprising:
 one or more integrated circuits embedded in the second primary side of the base portion or one or more electrically-driven devices physically coupled to the second primary side of the base portion,
 wherein at least a first one of the one or more integrated circuits or the one or more electrically-driven devices is on a first side of the slit,
 wherein at least a second one of the one or more integrated circuits or the one or more electrically-driven devices is on a second side of the slit opposite the first side of the slit, and
 wherein the slit severs a direct-line thermal coupling path via conduction through the base portion between the first one of the one or more integrated circuits or the one or more electrically-driven devices and the second one of the one or more integrated circuits or the one or more electrically-driven devices.

13. The apparatus of claim 1, wherein the silicon-based heat-dissipation device is made from a blank silicon substrate of single-crystal silicon, and wherein a ratio between a surface area of the protrusion portion and a surface area of the blank silicon substrate is in a range approximately between 5:1 and 40:1.

14. An apparatus, comprising:
 a silicon-based heat-dissipation device comprising:
  a base portion having a first primary side and a second primary side opposite the first primary side, wherein the second primary side accommodates one or more heat-generating devices being embedded therein or physically coupled thereto; and
  a protrusion portion on the first primary side of the base portion and protruding therefrom, the protrusion portion comprising a plurality of fins,
  wherein the base portion comprises a slit that communicatively connects the first primary side and the second primary side of the base portion,
  wherein the slit partially separates a first part of the base portion and a second part of the base portion such that the first part of the base portion is connected to the second part of the base portion near a first distal end of the slit and near a second distal end of the slit which is opposite the first distal end thereof,
  wherein each of at least two immediately adjacent fins of the fins of the protrusion portion has a tapered profile in a cross-sectional view with a first width near a distal end of the respective fin being less than a second width at a base of the respective fin near the base portion of the heat-dissipation device, and
  wherein at least a first fin of the tapered fins has a tapered angle between a surface of the first fin and a normal line perpendicular to a horizontal plane defined by the first primary side of the base portion, and wherein the tapered angle is less than or equal to 5 degrees and greater than 2 degrees, and
  wherein at least one fin of the plurality of fins is dissected by the slit into two separate fins.

15. The apparatus of claim 14,
wherein at least one portion of the slit extends in a direction perpendicular to a direction in which the plurality of fins extend, and wherein at least one fin of the plurality of fins is dissected by the at least one portion of the slit into two separate fins.

16. The apparatus of claim 4, further comprising:
a copper layer coupled to the second primary side of the base portion, a thickness of the copper layer being in a range of approximately 3 μm to 30 μm.

17. The apparatus of claim 14, further comprising:
one or more integrated circuits embedded in the second primary side of the base portion or one or more electrically-driven devices physically coupled to the second primary side of the base portion,
wherein at least a first one of the one or more integrated circuits or the one or more electrically-driven devices is on a first side of the slit,
wherein at least a second one of the one or more integrated circuits or the one or more electrically-driven devices is on a second side of the slit opposite the first side of the slit, and
wherein the slit severs a direct-line thermal coupling path via conduction through the base portion between the first one of the one or more integrated circuits or the one or more electrically-driven devices and the second one of the one or more integrated circuits or the one or more electrically-driven devices.

18. The apparatus of claim 14, wherein the silicon-based heat-dissipation device is made from a blank silicon substrate of single-crystal silicon, and wherein a ratio between a surface area of the protrusion portion and a surface area of the blank silicon substrate is in a range approximately between 5:1 and 40:1.

* * * * *